(12) United States Patent
Mafune

(10) Patent No.: US 11,587,797 B2
(45) Date of Patent: Feb. 21, 2023

(54) SEMICONDUCTOR DEVICE, METHOD FOR MANUFACTURING THE SAME, AND POWER CONVERTER

(71) Applicant: Mitsubishi Electric Corporation, Tokyo (JP)

(72) Inventor: Masayuki Mafune, Tamba (JP)

(73) Assignee: Mitsubishi Electric Corporation, Tokyo (JP)

( * ) Notice: Subject to any disclaimer, the term of this patent is extended or adjusted under 35 U.S.C. 154(b) by 306 days.

(21) Appl. No.: 16/583,096

(22) Filed: Sep. 25, 2019

(65) Prior Publication Data
US 2020/0161145 A1 May 21, 2020

(30) Foreign Application Priority Data
Nov. 20, 2018 (JP) .............................. JP2018-217241

(51) Int. Cl.
| | | |
|---|---|---|
| H01L 21/48 | (2006.01) | |
| H01L 23/492 | (2006.01) | |
| H02M 7/5387 | (2007.01) | |

(52) U.S. Cl.
CPC ...... *H01L 21/4878* (2013.01); *H01L 23/4924* (2013.01); *H02M 7/5387* (2013.01)

(58) Field of Classification Search
CPC ..... H01L 21/48; H01L 23/492; H02M 7/5387
See application file for complete search history.

(56) References Cited

U.S. PATENT DOCUMENTS

| | | | |
|---|---|---|---|
| 5,606,200 A | 2/1997 | Haraguchi et al. | |
| 9,236,316 B2 | 1/2016 | Fujino et al. | |
| 2005/0161778 A1 | 7/2005 | Morelle | |
| 2006/0012032 A1* | 1/2006 | Paulus | H01L 23/49861 257/706 |
| 2016/0336252 A1* | 11/2016 | Houzouji | H01L 25/115 |

FOREIGN PATENT DOCUMENTS

| | | |
|---|---|---|
| JP | 2007-305643 A | 11/2007 |
| JP | 2014-011236 A | 1/2014 |
| JP | 2014-120592 A | 6/2014 |

OTHER PUBLICATIONS

An Office Action mailed by the German Patent and Trademark Office dated Dec. 21, 2021, which corresponds to German Patent Application No. 10 2019 217 489.2 and is related to U.S. Appl. No. 16/583,096; with English language translation.
An Office Action; "Notice of Reasons for Refusal", mailed by the Japanese Patent Office dated Oct. 19, 2021, which corresponds to Japanese Patent Application No. 2018-217241 and is related to U.S. Appl. No. 16/583,096; with English language translation.

\* cited by examiner

*Primary Examiner* — Sheng-Bai Zhu
(74) *Attorney, Agent, or Firm* — Studebaker & Brackett PC

(57) ABSTRACT

A semiconductor device includes a metal base plate, a case component, and a metal component. The metal component is fixed to the case component. A partial region of the metal component is exposed from the case component. The partial region is bonded to the base plate in a bonding portion. In the bonding portion, a surface of the partial region and a surface of the base plate are in direct contact with each other and integrated.

4 Claims, 23 Drawing Sheets

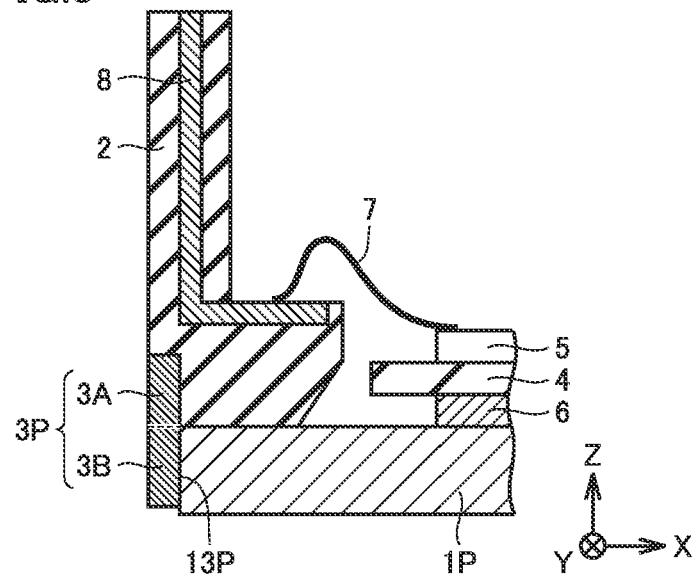
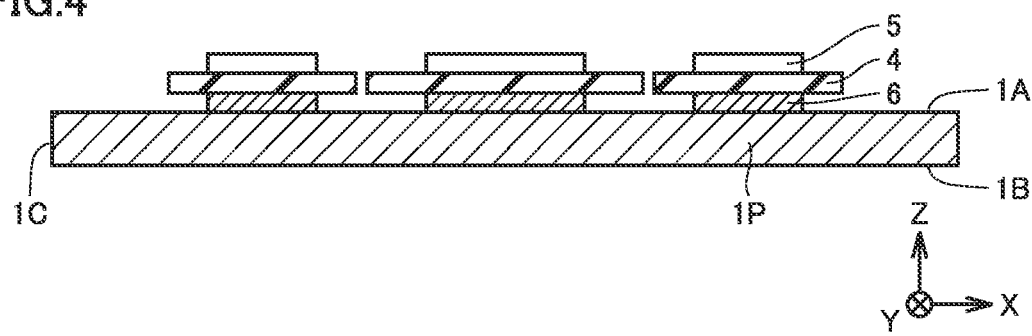

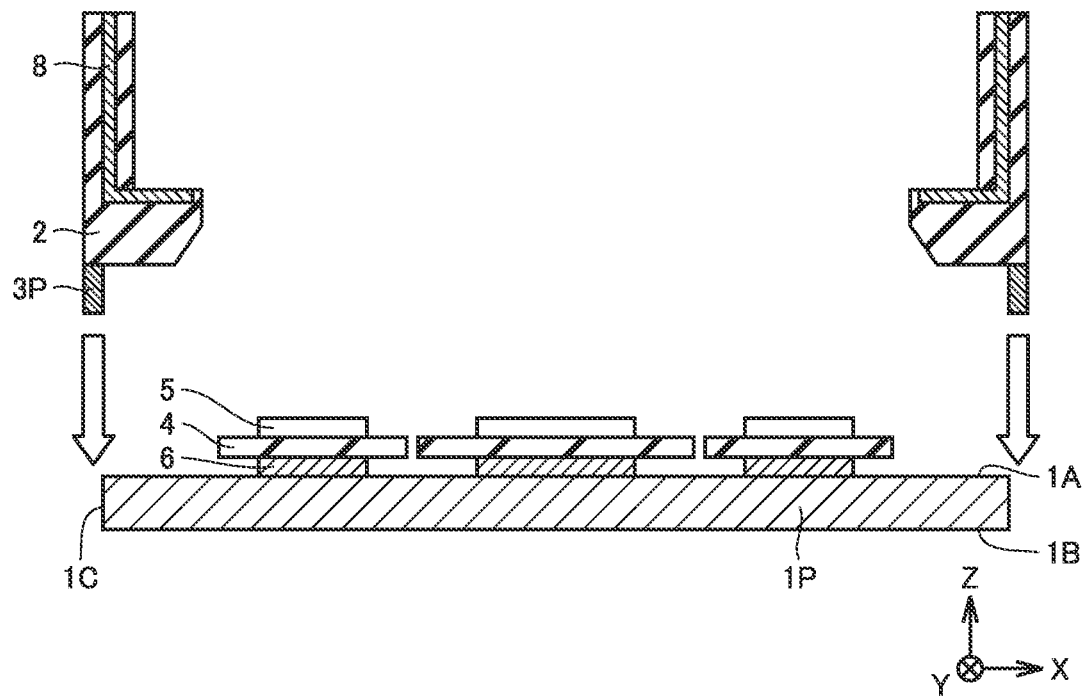
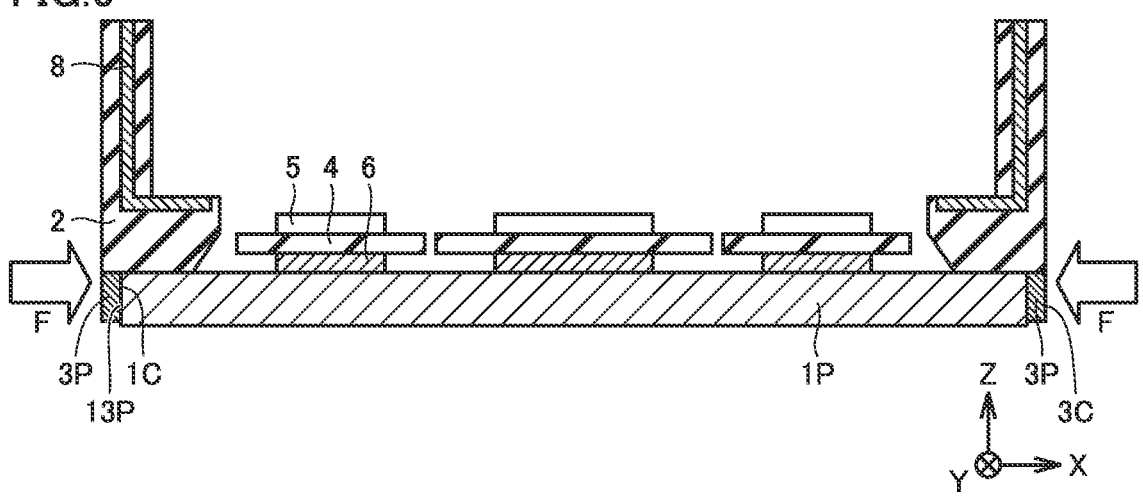

SEMICONDUCTOR DEVICE, METHOD FOR MANUFACTURING THE SAME, AND POWER CONVERTER

BACKGROUND OF THE INVENTION

Field of the Invention

The present invention relates to a semiconductor device, a method for manufacturing the same, and a power converter.

Description of the Background Art

In a power module in which a power semiconductor element and a diode are bonded together on an insulating substrate, the power semiconductor element and the diode are sealed by an insulating sealing material such as a silicone gel and an epoxy resin. For this purpose, a container-shaped member in which a base plate and a case component are bonded together, namely, a casing is previously prepared. The power semiconductor element and the like are disposed and sealed in the casing. For example, in Japanese Patent Laying-Open No. 2014-11236, the base plate and the case component are bonded together by solder as an adhesive such that the insulating sealing material does not leak from an inside of the casing constructed with the base plate and the case component.

SUMMARY OF THE INVENTION

In Japanese Patent Laying-Open No. 2014-11236, in order to prevent the insulating sealing material from leaking from the inside of the casing constructed with the base plate and the case component, it is necessary that the adhesive be applied to perform a curing process on the adhesive. For this reason, man-hours are increased, a work period is lengthened, and manufacturing cost is increased.

The present invention has been made in view of the above problems. An object of the present invention is to provide a semiconductor device in which the base plate and the case component can be bonded with less man-hour and lower cost, a method for manufacturing the same, and a power converter including the semiconductor device.

According to one aspect of the present invention, a semiconductor device includes a metal base plate, a case component, and a metal component. The metal component is fixed to the case component. A partial region of the metal component is exposed from the case component. The partial region is bonded to the base plate in a bonding portion. In the bonding portion, a surface of the partial region and a surface of the base plate are in direct contact with each other and integrated.

According to another aspect of the present invention, a method for manufacturing a semiconductor device includes the steps of: preparing a metal base plate; forming a case component in a metal component by insert molding such that at least a part of the metal component is fixed; and bonding a partial region exposed from the case component in the insert-molded metal component and a based plate. In the bonding step, a surface of the partial region and a surface of the base plate are in direct contact with each other and integrated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic enlarged sectional view illustrating an example of an aspect in which a portion of a metal component in FIG. 2 is more correctly illustrated.

FIG. 4 is a schematic sectional view illustrating a first process of a method for manufacturing the power module of the first embodiment.

FIG. 5 is a schematic sectional view illustrating a second process of the method for manufacturing the power module of the first embodiment.

FIG. 6 is a schematic sectional view illustrating a third process of the method for manufacturing the power module of the first embodiment.

DESCRIPTION OF THE PREFERRED EMBODIMENTS

Hereinafter, embodiments of the present invention will be described with reference to the drawings.

First Embodiment

Figure 1:
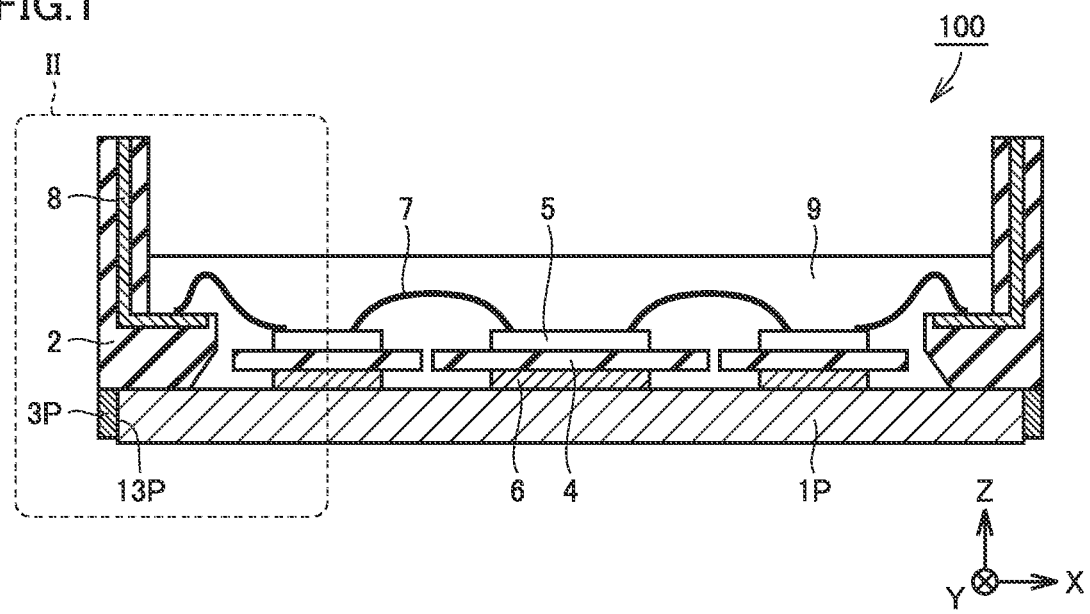
FIG. 1 is a schematic sectional view illustrating a configuration of a power module according to a first embodiment.
Figure 2:
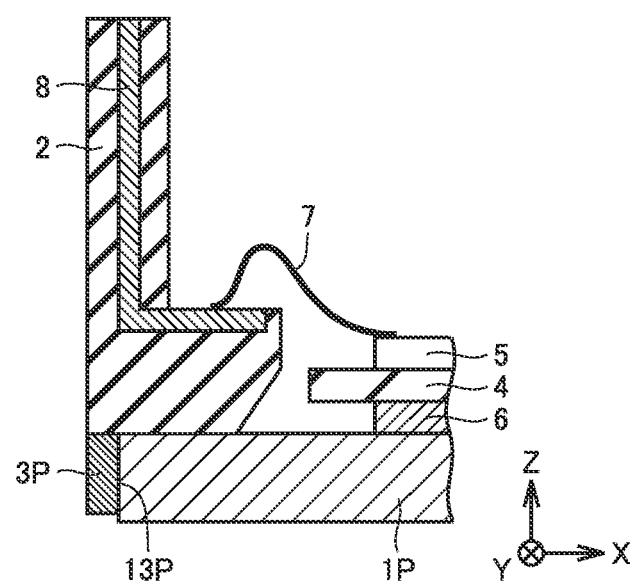
FIG. 2 is a schematic enlarged sectional view illustrating a portion II surrounded by a dotted line in FIG. 1.

With reference to FIGS. 1 to 3, a configuration of a power module as a semiconductor device of a first embodiment will be described. An X-direction, a Y-direction, and a Z-direction are introduced for the convenience of description.

FIG. 1 is a schematic sectional view illustrating the configuration of the power module of the first embodiment. FIG. 2 is a schematic enlarged sectional view illustrating a portion II surrounded by a dotted line in FIG. 1. FIG. 3 is a schematic enlarged sectional view illustrating an example of an aspect in which a portion of a metal component in FIG. 2 is more correctly illustrated.

Referring to FIG. 1, a power module 100 of the first embodiment mainly includes a base plate 1P, a case component 2, a metal component 3P, an insulating substrate 4, and a semiconductor element 5.

Base plate 1P radiates heat generated by the semiconductor element (to be described later) from a lower side in the Z-direction to an outside of power module 100. For example, base plate 1P has a rectangular shape in planar view and a flat plate shape having a thickness in the Z-direction. Preferably, base plate 1P is made of a metal material, such as copper and aluminum, which has excellent thermal conductivity.

Case component 2 is attached so as to substantially surround base plate 1P in planar view. Case component 2 has a substantially rectangular frame shape in planar view. Case component 2 has a dimension larger than that of base plate 1P in the Z-direction. For this reason, case component 2 to base plate 1P constitute a container-shaped casing by attaching case component 2 to base plate 1P. Case component 2 can electrically be connected to the semiconductor element by connecting a bonding wire (to be described later), so that a lower region in the Z-direction may become thicker than an upper region in the Z-direction in an inner wall surface in the X-direction and the Y-direction. In this case, a step is formed at a boundary between a thicker area and a thinner area of the inner wall surface in the X-direction and the Y-direction. In case component 2, for example, the inner wall surface may extend so as to be inclined with respect to other portions in the lowermost portion in the Z-direction.

The insulating substrate, the semiconductor element, and the like (to be described later) are bonded and disposed in the casing, namely, a spatial region surrounded by an upper surface of base plate 1P and the inner wall surface of the frame of case component 2. For example, preferably case component 2 is made of any insulating resin material selected from a group consisting of a sulfide resin, a polyphenylene sulfide resin (PPS resin), a polyethylene terephthalate resin (PBT resin), an unsaturated polyester resin, and an epoxy resin.

Referring to FIGS. 1 and 2, for example, metal component 3P is fixed to case component 2 by an insert molding process. That is, in this case, case component 2 is an insert molding member formed by the insert molding process. In power module 100 of FIGS. 1 and 2, for example, metal component 3P contacts with the lowermost surface of case component 2, and is fixed to case component 2. In this case, as a part of metal component 3P, a region excluding the surface contacting with the lowermost surface of case component 2 is exposed from case component 2. Such an aspect may be applied as an example of a fixing aspect by the insert molding process of the metal component 3P to case component 2 in power module 100.

Referring to FIG. 3, for example, metal component 3P is also fixed to case component 2 by the insert molding process similarly to metal component 3P in FIGS. 1 and 2. However, metal component 3P in FIG. 3 includes an embedded region 3A and an exposed region 3B. Embedded region 3A is a part of metal component 3P, and is a region embedded in the resin material of case component 2 formed by the insert molding process. That is, embedded region 3A is a region covered with and hidden behind case component 2 in metal component 3P. Exposed region 3B is a part of a region except for embedded region 3A in metal component 3P. Exposed region 3B is a region where the surface is exposed from case component 2 without being covered with or hidden behind case component 2 formed by the insert molding process. That is, exposed region 3B is a region that is not covered with case component 2 in metal component 3P.

As illustrated in FIG. 3, it is assumed that a part of the region of metal component 3P of power module 100 in FIG. 1 is embedded in case component 2, and that a part of other regions is exposed from the lowermost portion of case component 2. In this case, metal component 3P is fixed to case component 2 in a portion where metal component 3P is embedded in case component 2. Such an aspect may be applied as an example of a fixing aspect by the insert molding process of the metal component 3P to case component 2 in power module 100. That is, metal component 3P in power module 100 can be applied to both the aspect in which metal component 3P contacts with the lowermost surface of case component 2 while a whole of a portion except for the contact portion is exposed as illustrated in FIG. 2 and the aspect in which metal component 3P includes the embedded region 3A and exposed region 3B as illustrated in FIG. 3. However, in the following drawings, metal component 3P may be displayed as illustrated in FIG. 2 as a schematic diagram in which the aspect in FIG. 3 is simplified. In this case, metal component 3P in FIG. 2 is common to metal component 3P in FIG. 3 in that metal component 3P extends in the Z-direction from the lowermost portion of case component 2. For this reason, FIG. 2 conceptually includes both the aspect in FIG. 2 and the aspect in FIG. 3. Preferably, metal component 3P extends in the Z-direction, and has a rectangular frame shape (annular shape) in planar view. However, the present invention is not limited to the rectangular frame shape, but may have a circular frame shape in planar view.

Referring to FIGS. 1 to 3 again, in power module 100, the region where of the metal component 3P is exposed from the case component 2 is bonded to base plate 1P at a bonding portion 13P. In bonding portion 13P, the surface of the partial region of metal component 3P exposed from case component 2 and the surface of base plate 1P are in direct contact with each other and integrated. As used herein, the term "direct contact" means that no other material is included between a constituent material of metal component 3P and a constituent material of base plate 1P.

Specifically, in power module 100, the surface of metal component 3P and the side surface of base plate 1P are in direct contact with each other, and bonded together as bonding portion 13P at the boundary between metal component 3P and base plate 1P. The side surface of the base plate 1P is a surface extending in the Z-direction so as to connect a main surface on the upper side in the Z-direction of base plate 1P and a main surface on the lower side in the Z-direction. In power module 100, bonding portion 13P is disposed on the side surface that is the surface of base plate 1P as a portion to which the surface of exposed region 3B in FIG. 3, for example, the partial region of metal component 3P adheres.

Thus, base plate 1P is bonded so as to be fitted in exposed region 3B that is fixed to and exposed from case component 2.

Additionally, power module 100 includes the following members, and has the following configuration. Insulating substrate 4 is disposed on the upper side of the main surface on the upper side in the Z-direction of base plate 1P. Semiconductor element 5 is bonded onto insulating substrate 4. For example, the lower main surface in the Z-direction of insulating substrate 4 is bonded to the upper main surface in the Z-direction of base plate 1P by solder 6.

For example, insulating substrate 4 has a rectangular shape in planar view and a flat plate shape having a thickness in the Z-direction. A plurality of insulating substrates 4 may be bonded together on the main surface on the upper side in the Z-direction of base plate 1P at intervals. Insulating substrate 4 is made of a ceramic material such as aluminum oxide, aluminum nitride, and silicon nitride or a resin material such as an epoxy resin.

For example, semiconductor element 5 is a silicon semiconductor chip including a power semiconductor element. For example, semiconductor element 5 has a square or rectangular flat shape. Although not illustrated, for example, semiconductor element 5 is bonded onto the main surface on the upper side in the Z-direction of insulating substrate 4 by solder. A power control semiconductor element such as a MOSFET (Metal Oxide Semiconductor Field Effect Transistor) and an IGBT (Insulated Gate Bipolar Transistor), a reflux diode, or the like is used as the semiconductor element 5. One or a plurality of semiconductor elements 5 may be bonded onto one insulating substrate 4. For this reason, power module 100 may include the plurality of semiconductor elements 5.

In case component 2, a pair of semiconductor elements 5 adjacent to each other in planar view is electrically connected to each other by a bonding wire 7. An electrode 8 is formed so as to extend from the inside of case component 2 to the outside of case component 2. That is, for example, electrode 8 extends upward in the Z-direction while being buried in case component 2, and is exposed on the upper surface of case component 2 in the uppermost portion of electrode 8 although not illustrated. Electrode 8 is a terminal that electrically connects an internal circuit of power module 100 and an external circuit, namely, a terminal to which current and voltage are input and output. Although the lowermost portion of electrode 8 is buried in the casing, the uppermost surface of electrode 8 is exposed from case component 2. The portion of electrode 8 exposed from case component 2 is electrically connected to semiconductor element 5 by bonding wire 7.

For example, bonding wire 7 is a wire made of an aluminum alloy or a copper alloy having a wire diameter that is greater than or equal to 0.1 mm and less than or equal to 0.5 mm. Electrode 8 is a plate electrode made of copper.

In the casing constructed with base plate 1P, case component 2 and metal component 3P, a region where insulating substrate 4 and semiconductor element 5 are disposed is sealed by an insulating sealing material 9. That is, the region is filled with insulating sealing material 9 such that insulating sealing material 9 cover at least entire surfaces of semiconductor element 5 and bonding wire 7 (up to a height higher than highest positions in the Z-direction of semiconductor element 5 and bonding wire 7). On the other hand, a region on the upper side in the Z-direction of the casing is not necessarily filled with insulating sealing material 9 as illustrated in FIG. 1. Preferably insulating sealing material 9 is a hard resin material such as an epoxy resin or a phenol resin. However, when case component 2 made of the hard resin material is used, insulating sealing material 9 may be a soft resin material such as a silicone gel.

With reference to FIGS. 4 to 8, a method for manufacturing the power module of the first embodiment, particularly a process of forming the casing by bonding base plate 1P and case component 2 will be described below.

FIG. 4 is a schematic sectional view illustrating a first process of the method for manufacturing the power module of the first embodiment. Referring to FIG. 4, first, insulating substrate 4 having a conductive pattern (not illustrated) and base plate 1P made of metal are prepared on each of the upper and lower main surfaces. Insulating substrate 4 is bonded to one main surface 1A that is the upper main surface of base plate 1P by solder 6. For example, base plate 1P includes one rectangular main surface 1A and the other main surface 1B on an opposite side to main surface 1A. A side surface 1C extending in the Z-direction connecting one main surface 1A and other main surface 1B is formed in base plate 1P. Semiconductor element 5 is mounted on the upper main surface of insulating substrate 4 before insulating substrate 4 is bonded to one main surface 1A.

FIG. 5 is a schematic sectional view illustrating a second process of the method for manufacturing the power module of the first embodiment. Referring to FIG. 5, case component 2 including metal component 3P and electrode 8 is prepared. Case component 2 is formed by insert molding such that at least a part of metal component 3P is fixed. At this point, as illustrated in FIGS. 2 and 5, metal component 3P may be fixed by adhering or welding to the lowermost surface in the Z-direction of case component 2. Alternatively, as illustrated in FIG. 3, embedded region 3A that is a part of metal component 3P may be fixed so as to be embedded in, covered with, and hidden behind case component 2. Electrode 8 may also simultaneously be fixed to the inside of case component 2 as illustrated in FIG. 5. In this case, base plate 1P on which insulating substrate 4 is mounted as illustrated in FIG. 4 is also prepared.

FIG. 6 is a schematic sectional view illustrating a third process of the method for manufacturing the power module of the first embodiment. Referring to FIG. 6, base plate 1P is bonded to the partial region of metal component 3P, which is fixed to case component 2 by the insert molding in the process of FIG. 5 and exposed from case component 2. At this point, preferably the surface of the partial region of metal component 3P, namely, the surface of the region exposed from case component 2 and the surface of base plate 1P are in direct contact with each other and integrated. That is, as indicated by an arrow in FIG. 5, metal component 3P of case component 2 is moved so as to contact with side surface 1C of base plate 1P on which insulating substrate 4 is mounted. Metal component 3P is bonded to side surface 1C. Stress F indicated by an arrow in the drawing is applied such that a part of the surface of the metal component 3P adheres to side surface 1C of the base plate 1P while the part of the surface is in contact with side surface 1C. For example, when base plate 1P is rectangular shape, preferably stress F is substantially uniformly applied to four edges in a balanced manner. Preferably forces applied to each of the two opposing edges in the four edges are opposite in a direction and approximately equal in magnitude. Consequently, the force applied to base plate 1P is balanced. Thus, metal component 3P of case component 2 and base plate 1P are directly sealed to each other by metal bonding by pressure causing metal component 3P and base plate 1P to adhere to each other.

Figure 7:
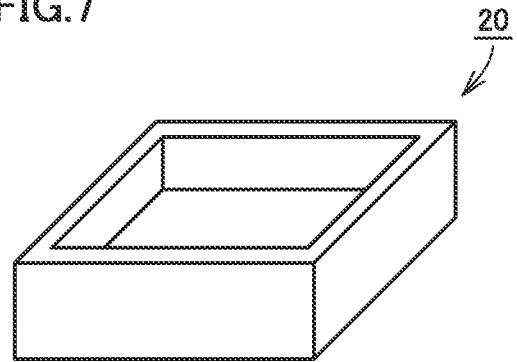
FIG. 7 is a schematic perspective view illustrating a tool used in an ultrasonic bonding process as a first example of the process in FIG. 6.

FIG. 7 is a schematic perspective view illustrating a tool used in an ultrasonic bonding process as a first example of the process in FIG. 6. Referring to FIG. 7, for example, preferably an ultrasonic bonding process is performed as the first example of the bonding process in FIG. 6. Preferably, an ultrasonic bonding tool 20 in FIG. 7 is used in the ultrasonic bonding process. For example, ultrasonic bonding tool 20 is a container-shaped member having a rectangular shape in planar view as illustrated in FIG. 7, and a spatial region is formed in ultrasonic bonding tool 20. Preferably, the ultrasonic bonding is performed by applying stress F as illustrated in FIG. 6. The inner wall surface of ultrasonic bonding tool 20 is disposed so as to sandwich side surface 3C, which is directed to the outside of base plate 1P and extends in the Z-direction in the portion where metal component 3P in FIG. 6 is exposed from case component 2. That is, side surface 3C is pressed against the inner wall surface of ultrasonic bonding tool 20. At this point, ultrasonic vibration is applied to ultrasonic bonding tool 20 to apply stress F in the direction in which metal component 3P and side surface 1C of base plate 1P adhere to each other. Exposed region 3B and side surface 1C of metal component 3P adhere to each other in this manner to perform metallic bonding between exposed region 3B and side surface 1C. Thus, bonding portion 13P that is a metallic-bonded portion is formed.

Figure 8:
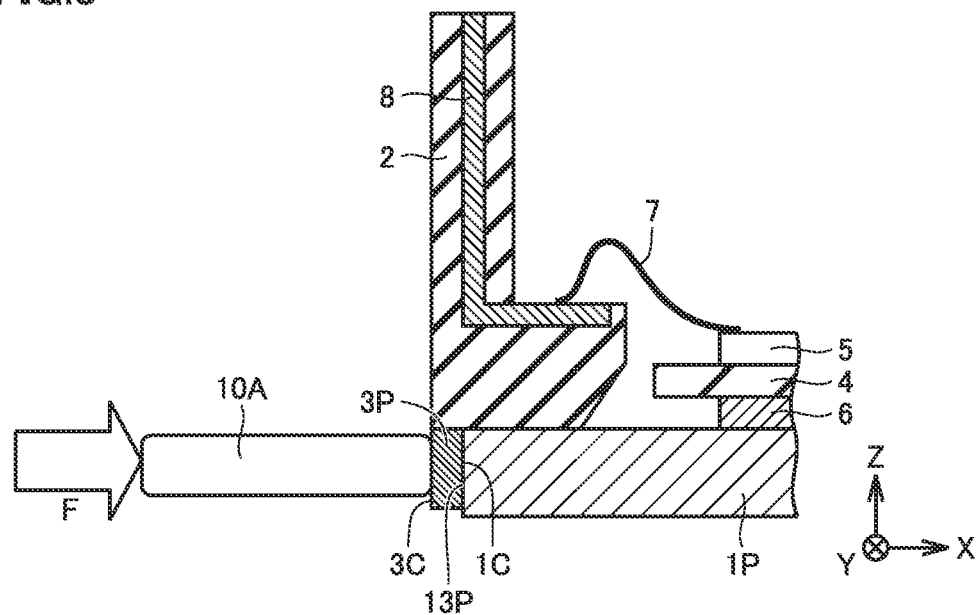
FIG. 8 is a schematic sectional view illustrating an aspect in which a pressure-bonding process is performed as a second example of the process in FIG. 6.

FIG. 8 is a schematic sectional view illustrating an aspect in which a pressure-bonding process is performed as a second example of the process in FIG. 6. Referring to FIG. 8, for example, the pressure-bonding process may be performed as a second example of the bonding process in FIG. 6. In this case, preferably a pressure-bonding jig 10A is used in order to apply stress F indicated by the arrow in the drawings. In pressure-bonding jig 10A, preferably a leading end that contacts with and applies the stress to side surface 3C has a substantially flat shape. Consequently, pressure-bonding jig 10A can contact with side surface 3C having the substantially flat shape, and apply the large stress. In the pressure-bonding process, preferably a heating temperature of an object is less than or equal to 250° C. Preferably a pressurization time of the object is less than or equal to 2 seconds. As described above, preferably stress F is uniformly applied to each of the four edges of rectangular base plate 1P.

Subsequently, a wire bonding process, a sealing process with insulating sealing material 9, and the like are performed. However, because each of these processes is performed by a known method, the detailed description is omitted. Thus, power module 100 is formed.

The advantageous effect of the first embodiment will be described below with reference to a comparative example in FIG. 9.

Figure 9:
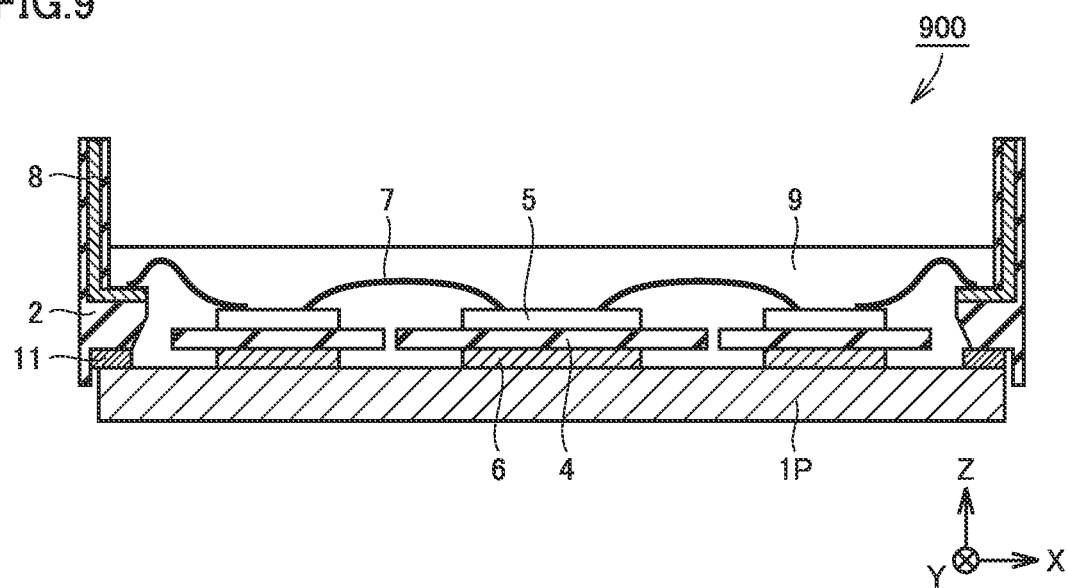
FIG. 9 is a schematic sectional view illustrating a configuration of a power module of a comparative example.

FIG. 9 is a schematic sectional view illustrating a configuration of a power module of the comparative example. Referring to FIG. 9, the same component of a power module 900 of the comparative example as the component of power module 100 is denoted by the same reference numeral as the components of power module 100, and the description will not be repeated. However, in power module 900 of FIG. 9, base plate 1P and case component 2 are bonded together by an adhesive 11 such as solder. The configuration of power module 900 is different from that of power module 100 in this point.

For example, when a metal component that is fixed to the case component 2 but not illustrated in FIG. 9 and base plate 1P are bonded together by the solder as adhesive 11, it is necessary to perform an application process of adhesive 11 and a curing process after the application. In this case, the increase in cost due to the increase in the number of processes and the like cannot be avoided.

In power module 900, for example, the metal component fixed to case component 2 and case component 2 are bonded together with adhesive 11 interposed therebetween. In this case, during the bonding with adhesive 11, large thermal stress due to heating is applied as compared with the first embodiment. For this reason, there is a possibility that the resin material constituting case component 2 cannot withstand the large thermal stress applied during the bonding. That is, the resin material of case component 2 may be damaged by the thermal stress.

In power module 100 of the first embodiment, the surface of exposed region 3B of metal component 3P and the surface of base plate 1P are in direct contact with each other and integrated using the ultrasonic bonding process or the pressure-bonding process with no use of adhesive 11. Bonding portion 13P formed in this way is disposed as a portion where the surface of exposed region 3B of metal component 3P is in close contact with the surface of base plate 1P. The thermal stress applied to case component 2 during the bonding process is smaller than the thermal stress applied to case component 2 during the bonding by adhesive 11. For this reason, a burden placed on the resin material of case component 2 can be reduced. Consequently, the damage to case component 2 can be prevented. The application process and the curing process of adhesive 11 are eliminated, so that the manufacturing cost can also be reduced.

In power module 100, exposed region 3B of metal component 3P extends from the lower side in the Z-direction of case component 2, and is bonded to base plate 1P. However, the present invention is not limited to the first embodiment. Alternatively, metal component 3P and base plate 1P may be bonded together as in each of the following modifications.

Figure 10:
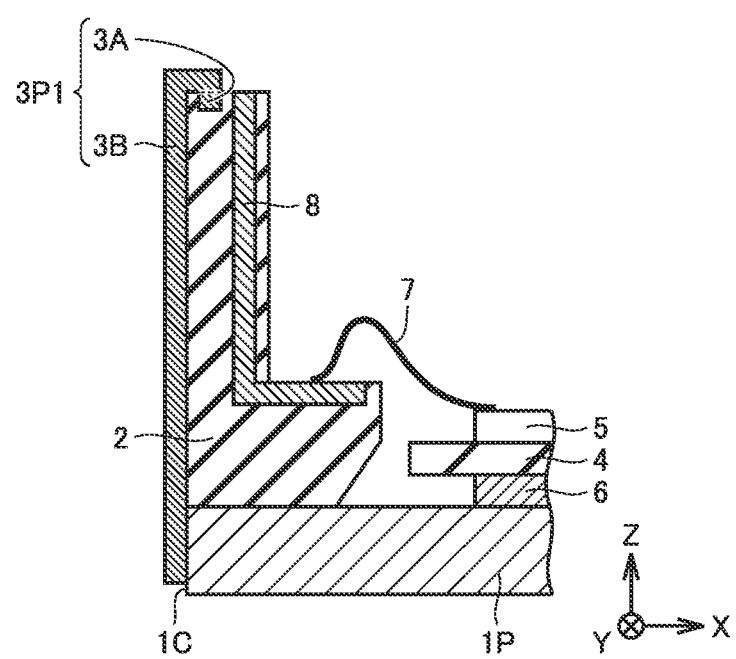
FIG. 10 is a schematic enlarged sectional view illustrating a portion in FIG. 2 in a first modification of the power module of the first embodiment.
Figure 11:
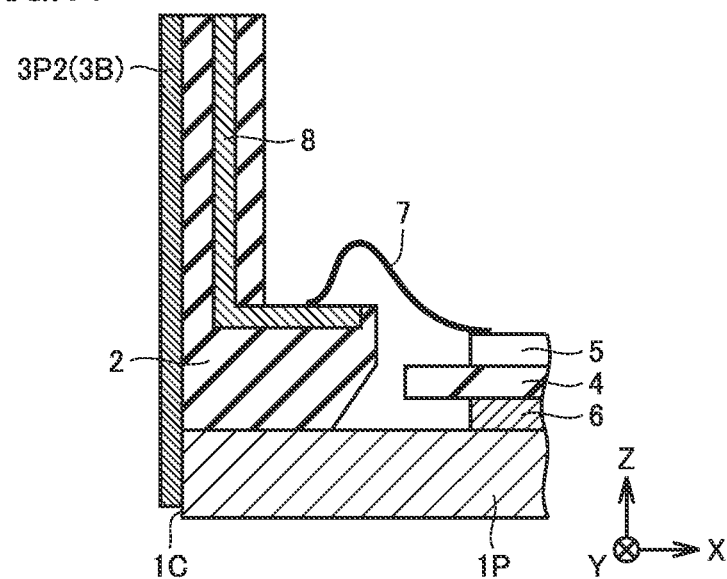
FIG. 11 is a schematic enlarged sectional view illustrating the portion in FIG. 2 in a second modification of the power module of the first embodiment.
Figure 12:
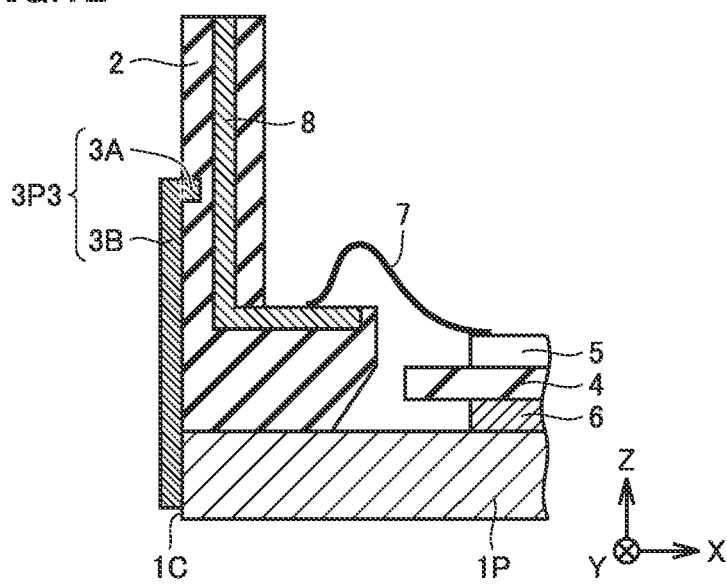
FIG. 12 is a schematic enlarged sectional view illustrating the portion in FIG. 2 in a third modification of the power module of the first embodiment.
Figure 13:
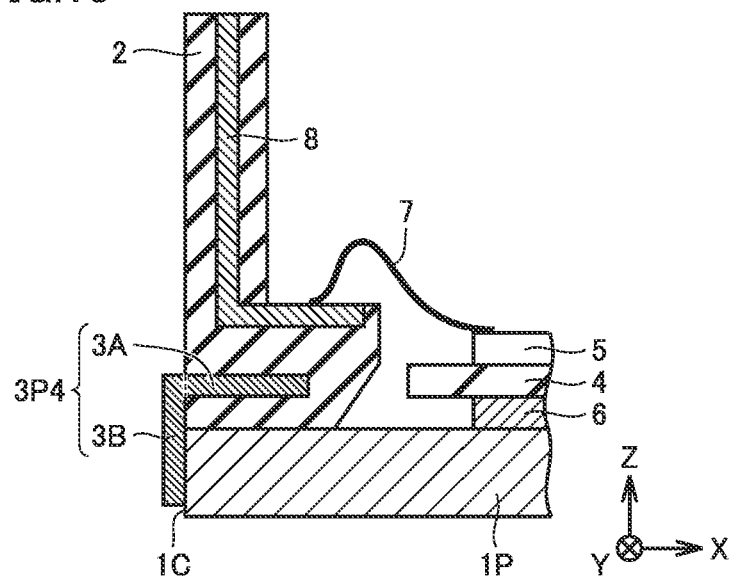
FIG. 13 is a schematic enlarged sectional view illustrating the portion in FIG. 2 in a fourth modification of the power module of the first embodiment.
Figure 14:
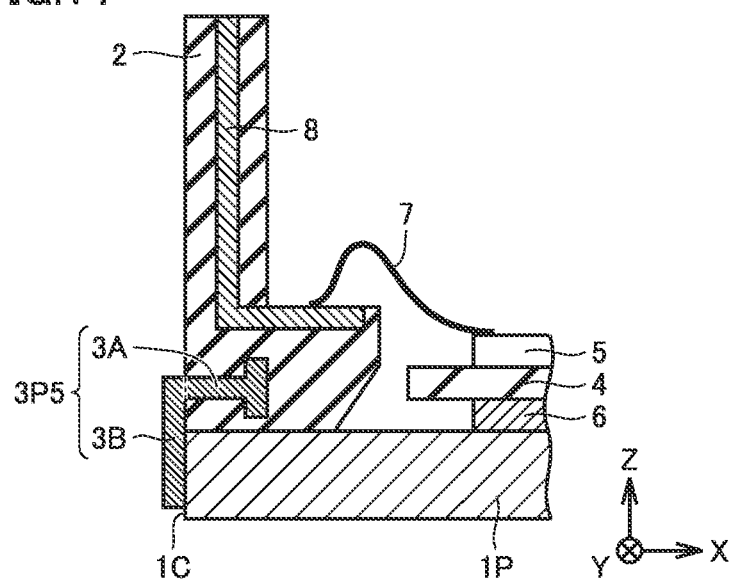
FIG. 14 is a schematic enlarged sectional view illustrating the portion in FIG. 2 in a fifth modification of the power module of the first embodiment.

FIG. 10 is a schematic enlarged sectional view illustrating a portion in FIG. 2 in a first modification of the power module of the first embodiment. FIG. 11 is a schematic enlarged sectional view illustrating the portion in FIG. 2 in a second modification of the power module of the first embodiment. FIG. 12 is a schematic enlarged sectional view illustrating the portion in FIG. 2 in a third modification of the power module of the first embodiment. FIG. 13 is a schematic enlarged sectional view illustrating the portion in FIG. 2 in a fourth modification of the power module of the first embodiment. FIG. 14 is a schematic enlarged sectional view illustrating the portion in FIG. 2 in a fifth modification of the power module of the first embodiment. All the configurations of the regions except for the regions illustrated in each of the modifications are similar to those in FIGS. 1 to 3, and the illustration and description will not be repeated.

Referring to FIGS. 10 to 14, a metal component 3P1 (the same shall apply hereinafter) that is metal component 3P in FIG. 1 fixed to case component 2 in the insert molding process may be exposed from the surface except for the lowermost portion in the Z-direction of case component 2. Specifically, as illustrated in FIG. 10, exposed region 3B of metal component 3P1 may be exposed from the uppermost portion in the Z-direction of case component 2, extend along the side surface of case component 2 extending in the Z-direction, and be bonded onto side surface 1C of base plate 1P. As illustrated in FIG. 11, exposed region 3B of a metal component 3P2 may extend so as to contact with the side surface of case component 2 extending in the Z-direction, and be bonded onto side surface 1C of base plate 1P. As illustrated in FIG. 12, exposed region 3B of a metal component 3P3 may protrude from the inside of case component 2 in a central portion in the Z-direction of case component 2, and extend downward in the Z-direction along the side surface of case component 2 extending in the Z-direction, and be bonded onto side surface 1C of base plate 1P. As illustrated in FIGS. 13 and 14, metal components 3P4, 3P5 may have the configuration in which embedded region 3A extends horizontally from the inside of case component 2 in the region having the large thickness in the X-direction in the lower portion in the Z-direction of case component 2. In metal components 3P4, 3P5, exposed region 3B protrudes from the side surface extending in the Z-direction of case component 2 having the large thickness in the X-direction, extends downward along the side surface of case component 2 extending in the Z-direction, and is bonded onto side surface 1C of base plate 1P. In FIG. 13, the end of embedded region 3A is disposed inside the inner wall surface of the region having the reduced thickness in the X-direction on the upper side in the Z-direction of case component 2. On the other hand, in FIG. 14, the end of embedded region 3A is disposed at an X-coordinate position substantially identical to that of the inner wall surface in the region having the reduced thickness in the X-direction on the upper side in the Z-direction of case component 2.

Each of metal components 3P in FIGS. 10, 12 to 14 has embedded region 3A in the uppermost portion in the Z-direction inside case component 2, but may not have embedded region 3A as in FIG. 2.

The surface of exposed region 3B of metal component 3P particularly means the inner wall surface opposed to side surface 1C, and the surface of base plate 1P particularly means side surface 1C. However, the present invention is not limited thereto. For example, surfaces such as the uppermost surface, the lowermost surface, and the outer wall surface except for the inner wall surface of exposed region 3B of metal component 3P, one main surface 1A of base plate 1P, and other main surface 1B may be in direct contact with each other and integrated.

Second Embodiment

Figure 15:
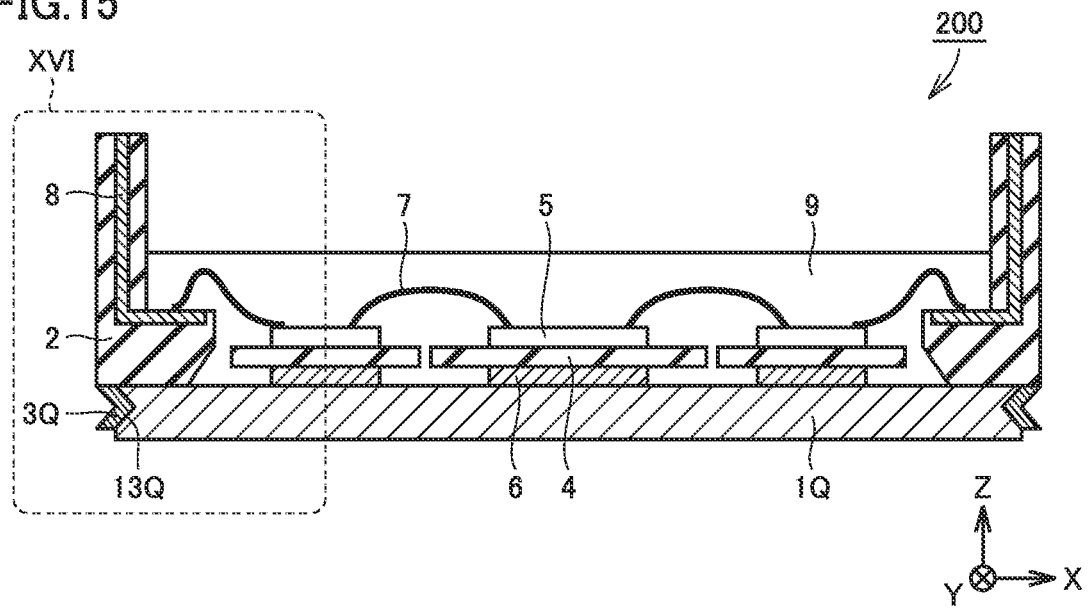
FIG. 15 is a schematic sectional view illustrating a configuration of a power module according to a second embodiment.
Figure 16:
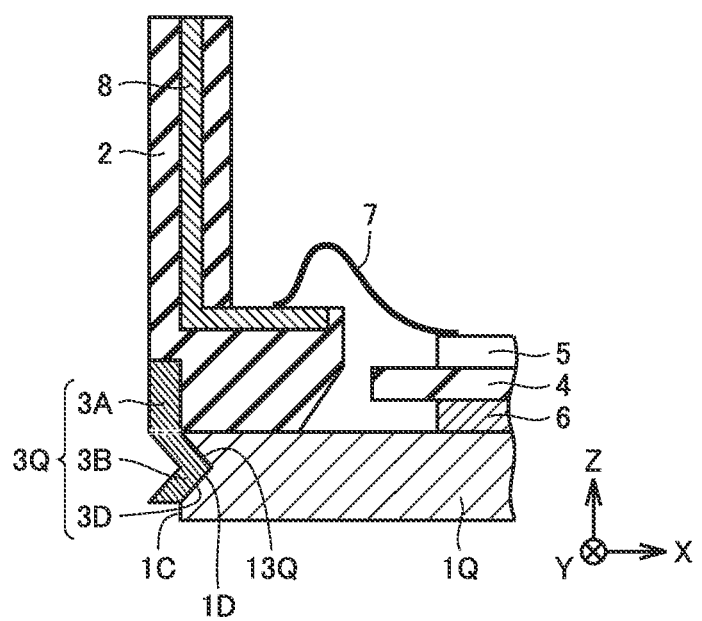
FIG. 16 is a schematic enlarged sectional view illustrating a portion XVI surrounded by a dotted line in FIG. 15.

FIG. 15 is a schematic sectional view illustrating a configuration of a power module according to a second embodiment. FIG. 16 is a schematic enlarged sectional view illustrating a portion XVI surrounded by a dotted line in FIG. 15.

Referring to FIG. 15, a power module 200 of the second embodiment substantially has the configuration similar to that of power module 100 of the first embodiment. For this reason, in FIG. 15, the same component as that in FIG. 1 is denoted by the same reference numeral, and the overlapping description will be omitted. However, the second embodiment is different from the first embodiment in the configurations of the base plate and the metal component.

Specifically, referring to FIGS. 15 and 16, in power module 200, a wedge-shaped portion 1D is formed on side surface 1C that is a part of the surface of a base plate 1Q. An exposed region 3B, which is a partial region of a metal component 3Q, is in close contact with the surface of wedge-shaped portion 1D. A bonding portion 13Q is disposed as the closely contact portion. That is, a part of metal component 3Q is fitted in wedge-shaped portion 1D so as to follow the shape of wedge-shaped portion 1D. Wedge-shaped portion 1D is a portion where a member constituting base plate 1 is cut out so as to have a substantially V-shape in sectional view.

A partial region of metal component 3Q is fitted in wedge-shaped portion 1D. For this reason, similarly to wedge-shaped portion 1D, metal component 3Q is bent so as to have a substantially V-shape in sectional view.

As in FIG. 2 of the first embodiment, FIG. 15 can be interpreted as a schematic diagram in which embedded region 3A in FIG. 16 is omitted. However, even in the second embodiment, as illustrated in FIG. 15, metal component 3Q may be in contact with the lowermost surface of case component 2, and the entire portion except for the contact portion may be exposed.

With reference to FIGS. 17 to 21, the method for manufacturing the power module of the second embodiment, particularly the process of forming the casing by bonding base plate 1Q and case component 2 will be described below. However, the description of the process that overlaps that of the first embodiment will not be repeated.

Figure 17:
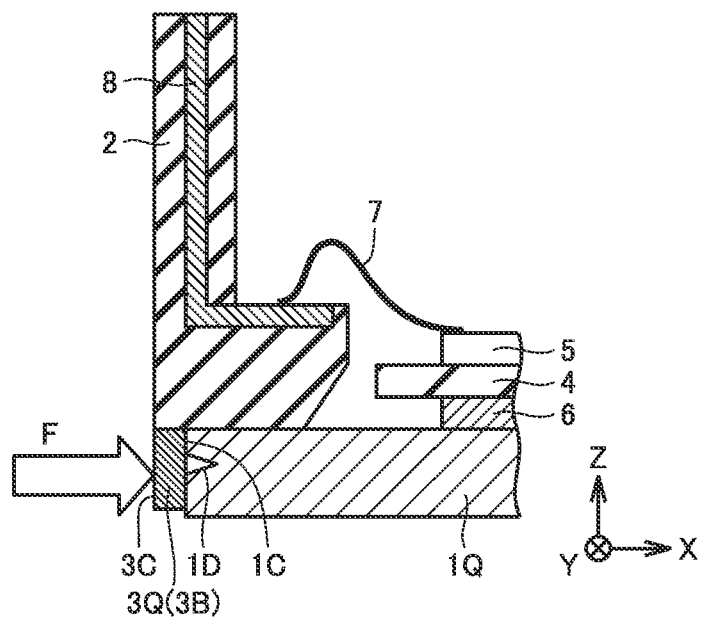
FIG. 17 is a schematic sectional view illustrating particularly a process of causing the metal component and a base plate to adhere to each other in the method for manufacturing the power module of the second embodiment.

FIG. 17 is a schematic sectional view illustrating particularly a process of causing the metal component and the base plate to adhere to each other in the method for manufacturing the power module of the second embodiment. Referring to FIG. 17, for example, base plate 1Q in which wedge-shaped portion 1D is formed on side surface 1C is prepared. In the process of bonding base plate 1Q and metal component 3Q, exposed region 3B that is the partial region of metal component 3Q is pressure-bonded to the V-shaped surface of wedge-shaped portion 1D formed on side surface 1C that is the surface of base plate 1Q. For this reason, stress F is applied to exposed region 3B of metal component 3Q so as to be directed to wedge-shaped portion 1D in FIG. 17.

Figure 18:
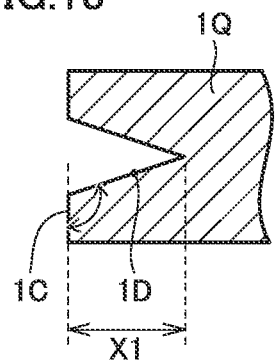
FIG. 18 is a schematic enlarged sectional view illustrating a wedge-shaped portion formed in the base plate of the power module of the second embodiment.

FIG. 18 is a schematic enlarged sectional view illustrating the wedge-shaped portion formed in the base plate of the power module of the second embodiment. Referring to FIG. 18, wedge-shaped portion 1D is formed by removing the components of base plate 1Q in a depth direction intersecting side surface 1C of base plate 1Q. Wedge-shaped portion 1D has a substantially isosceles triangle shape, and preferably an angle formed between wedge-shaped portion 1D and side surface 1C in FIG. 18 is greater than 90° and less than 180°. Preferably a depth of wedge-shaped portion 1D indicated by X1 in FIG. 18 is greater than or equal to ½ and less than or equal to double the thickness of base plate 1Q.

Figure 19:
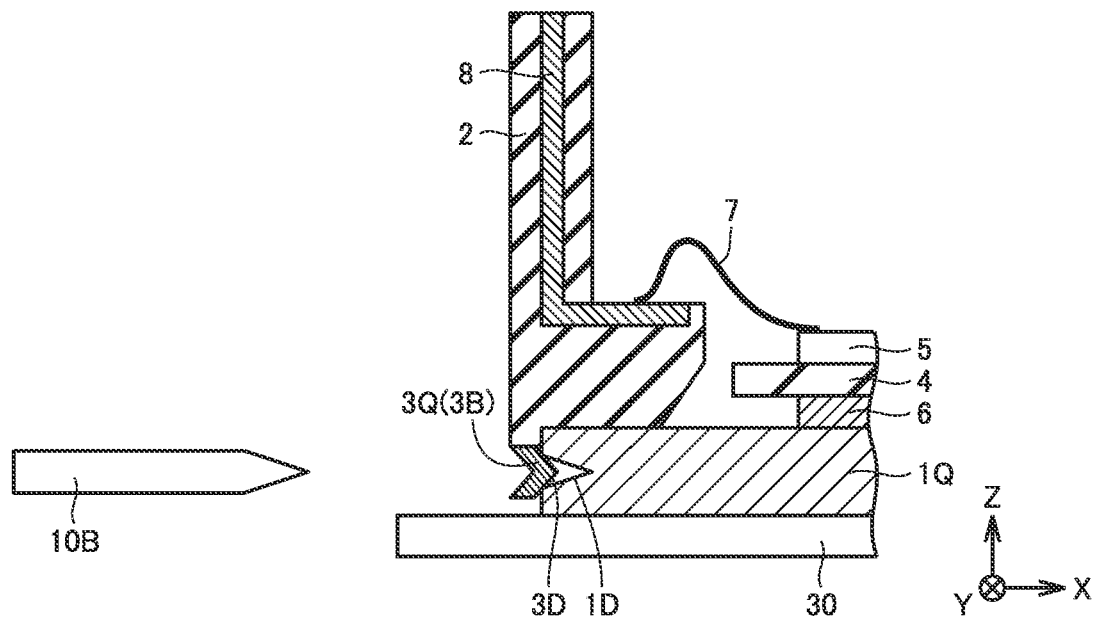
FIG. 19 is a schematic sectional view illustrating a first example in an aspect of the pressure-bonding process of the second embodiment.

FIG. 19 is a schematic sectional view illustrating a first example in an aspect of the pressure-bonding process of the second embodiment. Referring to FIG. 19, for example, a pressure-bonding jig 10B is used in the process of pressure-bonding metal component 3Q to wedge-shaped portion 1D of base plate 1Q in the second embodiment. For example, wedge-shaped portion 1D has an isosceles triangular sectional shape as illustrated in FIG. 18. Pressure-bonding jig 10B has a shape in which the leading end is pointed in an isosceles triangle shape so as to be fitted in the isosceles triangle shape, namely, the V-shape of wedge-shaped portion 1D. That is, preferably the angle of the isosceles triangle at the leading end of the pressure-bonding jig 10B is substantially equal to the angle of wedge-shaped portion 1D. Metal component 3Q is pressed by the pressure-bonding jig 10B under a heating condition. As a result, exposed region 3B of metal component 3Q is deformed so as to conform to the shapes of pressure-bonding jig 10B and wedge-shaped portion 1D on side surface 1C. As a result, exposed region 3B is fitted so as to invade into a notched portion of wedge-shaped portion 1D, and exposed region 3B and wedge-shaped portion 1D adhere to each other. Consequently, the pressure bonding is performed.

Figure 20:
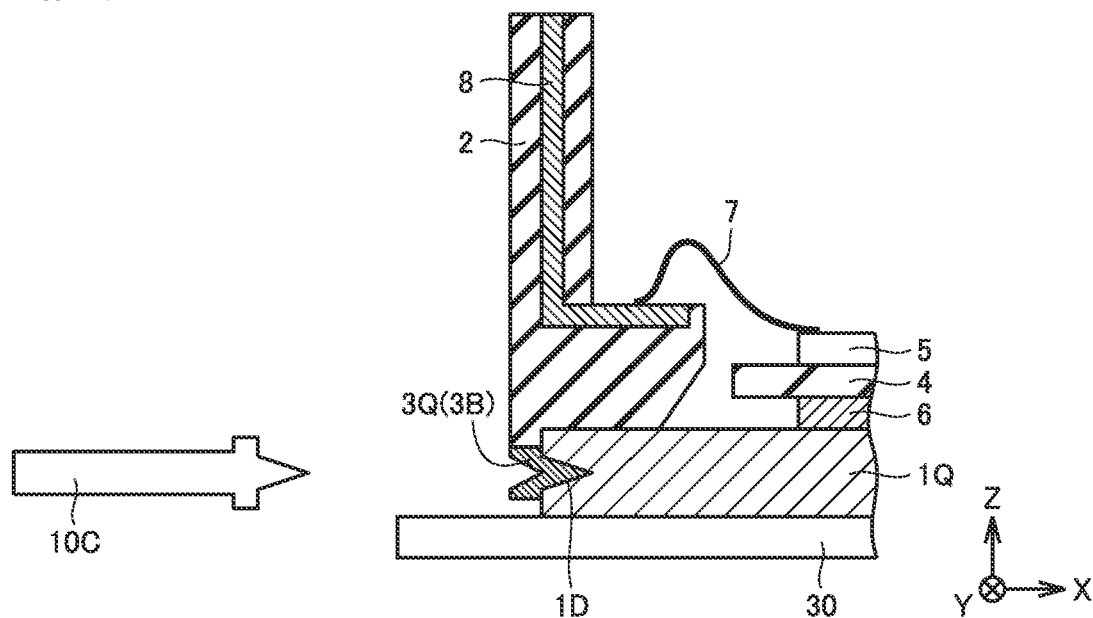
FIG. 20 is a schematic sectional view illustrating a second example in the aspect of the pressure-bonding process of the second embodiment.

FIG. 20 is a schematic sectional view illustrating a second example in the aspect of the pressure-bonding process of the second embodiment. Referring to FIG. 20, wedge-shaped portion 1D has the shape similar to that of FIG. 19. However, in addition to the pointed portion of the isosceles triangle shape fitted in wedge-shaped portion 1D, a flat portion extending along the Z-direction may be formed at the leading end of a pressure-bonding jig 10C. The flat portion has a role of preventing formation of machining burrs on a periphery, namely, the side surface of metal component 3Q fitted in wedge-shaped portion 1D. This is because the portion, namely, the processed surface of metal component 3Q pressure-bonded by pressure-bonding jig 10C becomes flat by being pressed against the flat portion of pressure-bonding jig 10C. Preferably the angle in the pointed portion of the isosceles triangle shape at the leading end of pressure-bonding jig 10C is equal to that of pressure-bonding jig 10B.

Figure 21:
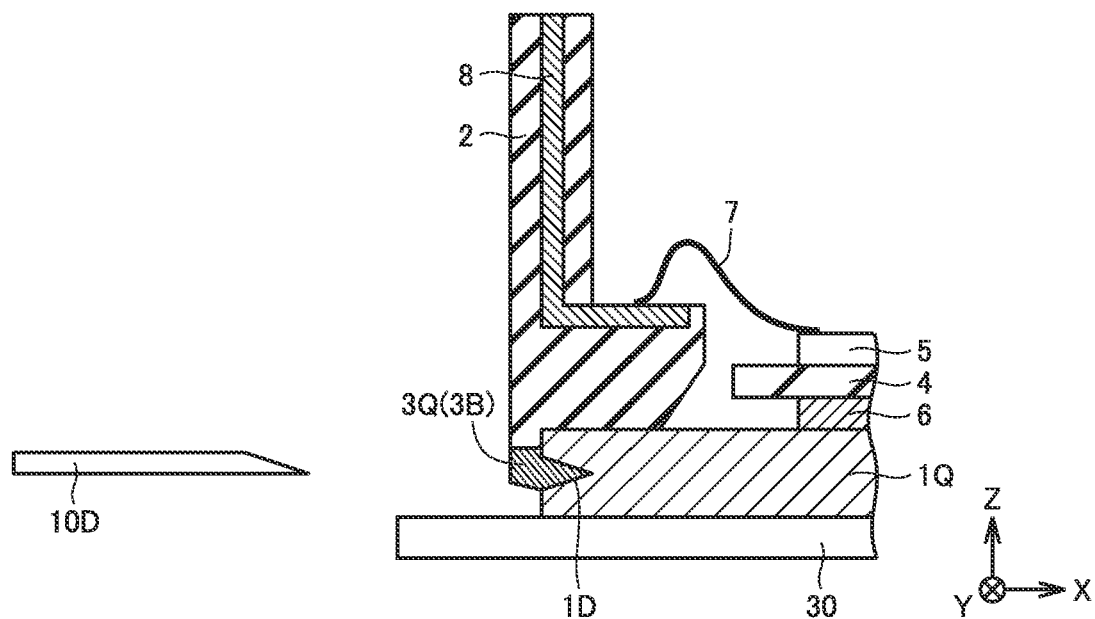
FIG. 21 is a schematic sectional view illustrating a third example in the aspect of the pressure-bonding process of the second embodiment.

FIG. 21 is a schematic sectional view illustrating a third example in the aspect of the pressure-bonding process of the second embodiment. Referring to FIG. 21, wedge-shaped portion 1D has the shape similar to that of FIG. 19. However, the leading end of a pressure-bonding jig 10D includes a tapered pointed portion fitted in wedge-shaped portion 1D on only one side in the Z-direction (in FIG. 21, only the upper side). For example, the tapered pointed portion may be formed over the entire dimension of pressure-bonding jig 10D in the Z-direction as illustrated in FIG. 21. However, the tapered pointed portion may be formed only in the partial region such as the upper half in the Z-direction. Consequently, the deformation of the lower portion in the Z-direction of base plate 1Q can be prevented. Preferably the angle of the pointed portion at the leading end of pressure-bonding jig 10D is equal to that of pressure-bonding jig 10B. Pressure-bonding jig 10D may include the tapered pointed portion only on the lower side in the Z-direction.

In any one of the examples in FIGS. 19 to 21, preferably the heating temperature of the object less than or equal to 250° C. in the pressure-bonding process. Preferably a pressurization time of the object is less than or equal to 2 seconds. As described above, preferably stress F is uniformly applied to each of the four edges of rectangular base plate 1Q. Consequently, metal component 3Q of case component 2 and the base plate 1Q are sealed. In any one of the examples in FIGS. 19 to 21, preferably base plate 1Q is placed on the upper surface of a jig 30 in the pressure-bonding process.

An advantageous effect of the second embodiment will be described below.

In the second embodiment, exposed region 3B of metal component 3Q insert-molded in the lower portion of case component 2 is pressed into a recessed portion of wedge-shaped portion 1D of the side surface of base plate 1Q by the pressure-bonding process. Consequently, the surface of metal component 3Q and the surface of wedge-shaped portion 1D come into direct contact with each other and are integrated by the adherence. Thus, the surface of metal component 3Q and the surface of wedge-shaped portion 1D are bonded together. When the pressure-bonding process is performed, the sealing process can easily be performed so as to increase a degree of adhesion by the use of pressure-bonding jigs 10B, 10C, 10D in FIGS. 19 to 21 rather than the use of pressure-bonding jig 10A having the flat leading end in FIG. 8. Because pressure-bonding jigs 10B, 10C, 10D have the pointed leading end, pressure-bonding jigs 10B, 10C, 10D have the structure more suitable for the pressure-bonding process than pressure-bonding jig 10A including the flat leading end.

Figure 22:
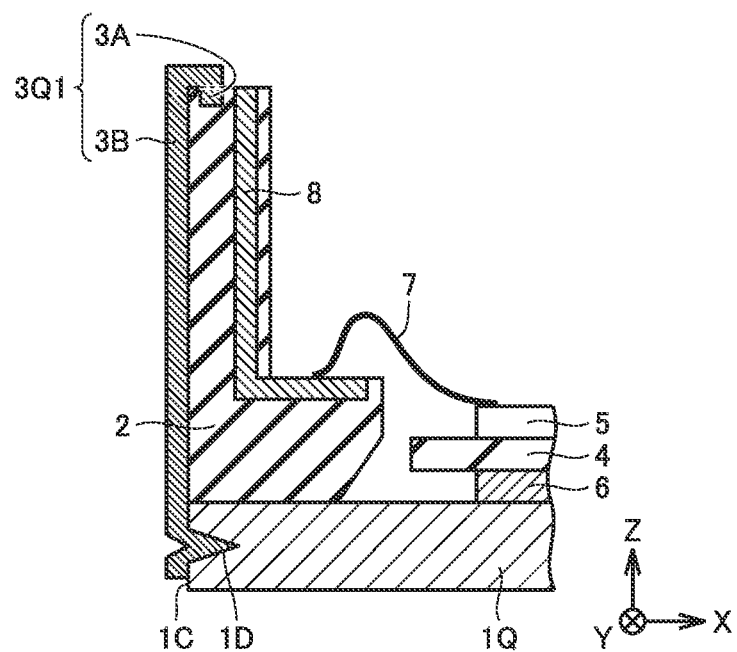
FIG. 22 is a schematic enlarged sectional view illustrating a portion in FIG. 16 in a first modification of the power module of the second embodiment.
Figure 23:
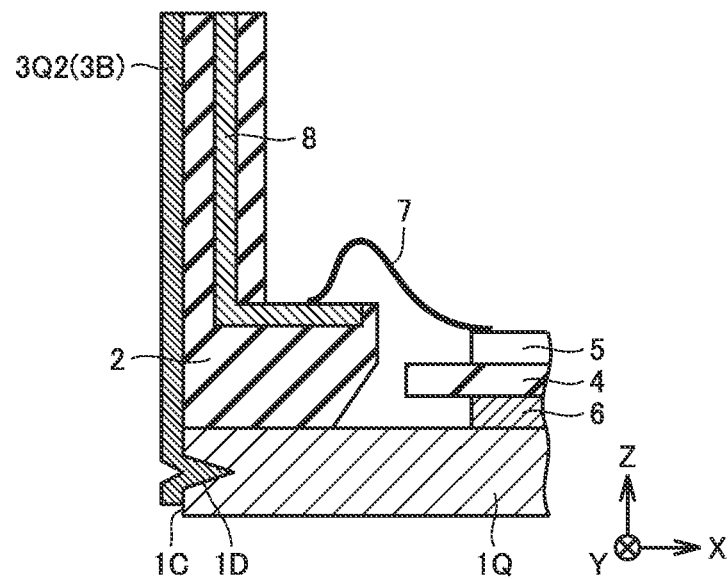
FIG. 23 is a schematic enlarged sectional view illustrating the portion in FIG. 16 in a second modification of the power module of the second embodiment.
Figure 24:
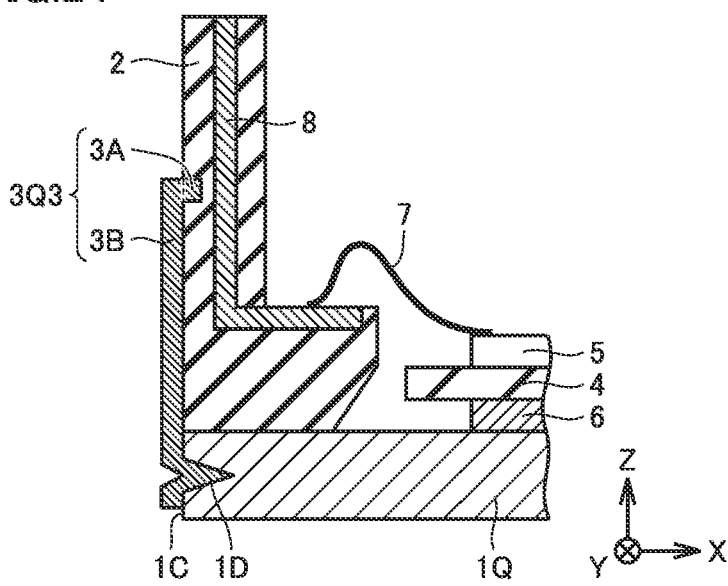
FIG. 24 is a schematic enlarged sectional view illustrating the portion in FIG. 16 in a third modification of the power module of the second embodiment.
Figure 25:
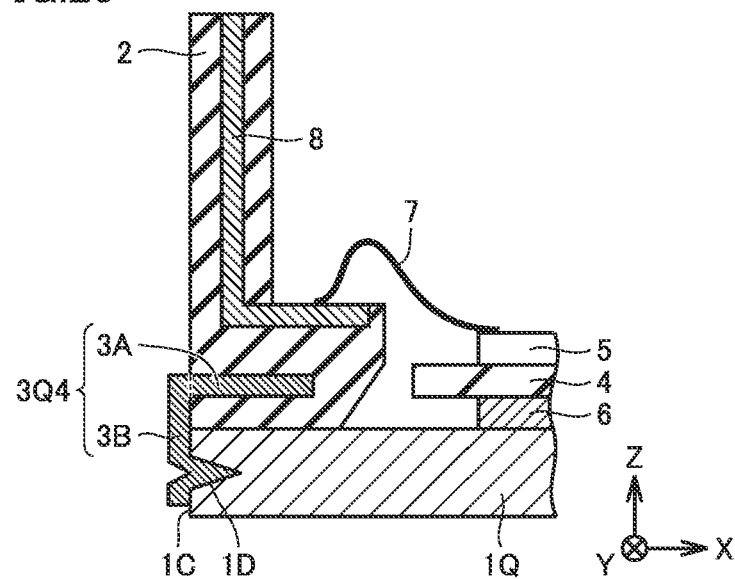
FIG. 25 is a schematic enlarged sectional view illustrating the portion illustrated in FIG. 16 of the fourth modification of the power module of the second embodiment.
Figure 26:
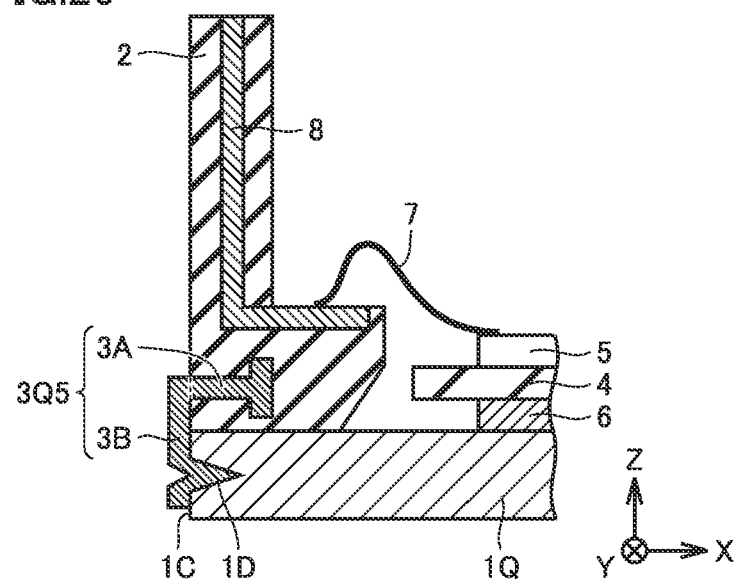
FIG. 26 is a schematic enlarged sectional view illustrating the portion in FIG. 16 in a fifth modification of the power module of the second embodiment.

FIG. 22 is a schematic enlarged sectional view illustrating a portion in FIG. 16 in a first modification of the power module of the second embodiment. FIG. 23 is a schematic enlarged sectional view illustrating the portion in FIG. 16 in a second modification of the power module of the second embodiment. FIG. 24 is a schematic enlarged sectional view illustrating the portion in FIG. 16 in a third modification of the power module of the second embodiment. FIG. 25 is a schematic enlarged sectional view illustrating the portion in FIG. 16 in a fourth modification of the power module of the second embodiment. FIG. 26 is a schematic enlarged sectional view illustrating the portion in FIG. 16 in a fifth modification of the power module of the second embodiment. All the configurations of the regions except for the regions illustrated in each of the modifications are similar to those in FIGS. 15 to 17, and the illustration and description will not be repeated.

Referring to FIGS. 22 to 26, because metal components 3Q1, 3Q2, 3Q3, 3Q4, 3Q5 of these modifications are similar to metal components 3P1 to 3P5 in FIGS. 10 to 14 except that metal components 3Q1, 3Q2, 3Q3, 3Q4, 3Q5 are pressure-bonded to wedge-shaped portion 1D of base plate 1Q, the detailed description will not be repeated. Even in the second embodiment, embedded region 3A and exposed region 3B having the configuration similar to that in FIGS. 10 to 14 may be included.

The surface of exposed region 3B of metal component 3Q particularly means the inner wall surface opposed to side surface 1C, and the surface of base plate 1Q particularly means side surface 1C. However, the present invention is not limited thereto. For example, surfaces such as the uppermost surface, the lowermost surface, and the outer wall surface except for the inner wall surface of exposed region 3B of metal component 3Q, one main surface 1A of base plate 1Q, and other main surface 1B may be in direct contact with each other and integrated. That is, the position where wedge-shaped portion 1D is formed is not limited to the side surface 1C in the surface of base plate 1Q. Although not illustrated, wedge-shaped portion 1D may be formed on one main surface 1A or other main surface 1B (see FIG. 4) of base plate 1Q.

Third Embodiment

Figure 27:
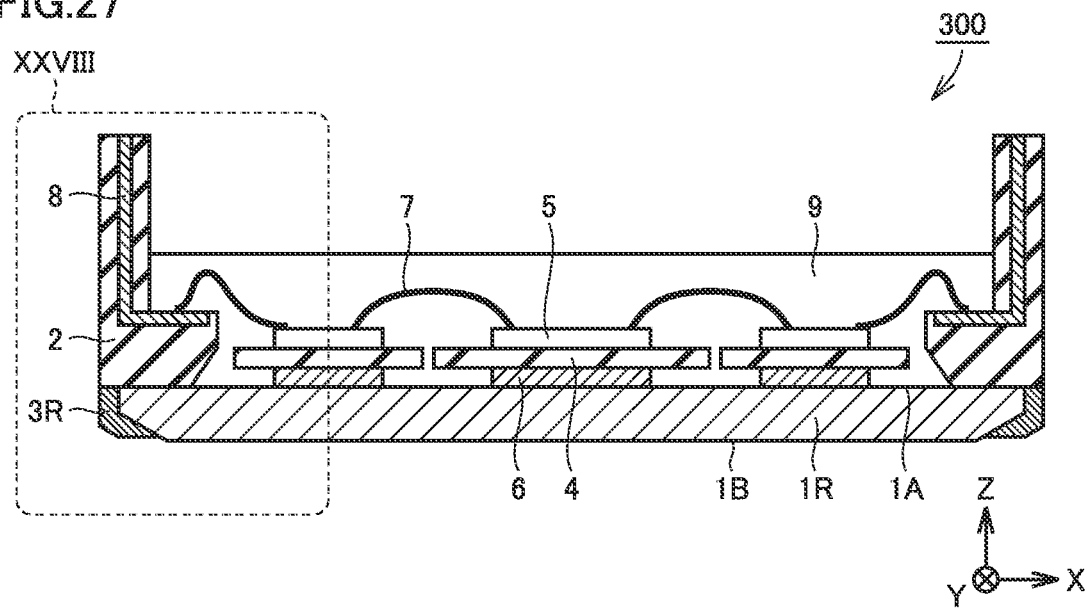
FIG. 27 is a schematic sectional view illustrating a configuration of a power module according to a third embodiment.
Figure 28:
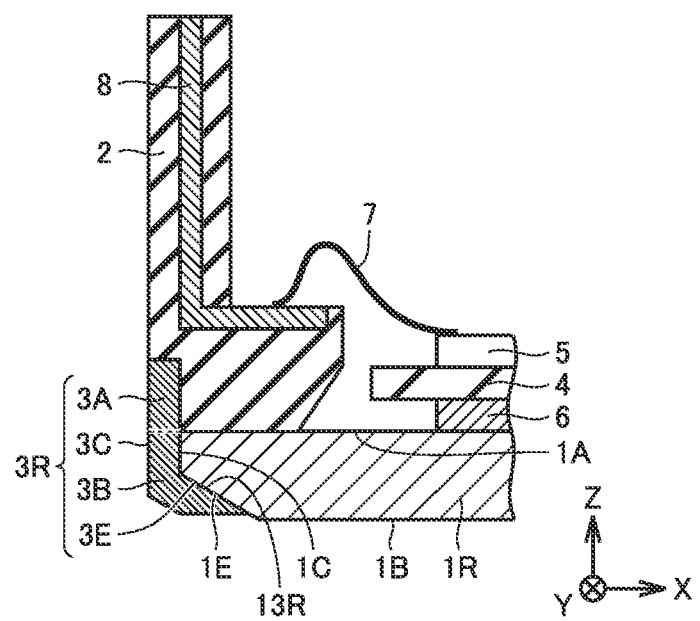
FIG. 28 is a schematic enlarged sectional view illustrating a portion XXVIII surrounded by a dotted line in FIG. 27.

FIG. 27 is a schematic sectional view illustrating a configuration of a power module according to a third embodiment. FIG. 28 is a schematic enlarged sectional view illustrating a portion XXVIII surrounded by a dotted line in FIG. 27.

Referring to FIG. 27, a power module 300 of the third embodiment substantially has the configuration similar to that of power module 100 of the first embodiment. For this reason, in FIG. 27, the same component as that in FIG. 1 is denoted by the same reference numeral, and the overlapping description will be omitted. However, the third embodiment is different from the first embodiment in the configurations of the base plate and the metal component.

Specifically, referring to FIGS. 27 and 28, a slope 1E connecting other main surface 1B and side surface 1C in an oblique direction with respect to one main surface 1A and other main surface 1B on an opposite side to main surface 1A of a base plate 1R and the Z-direction perpendicular to one main surface 1A and other main surface 1B are formed in power module 300. In power module 300, a bonding portion 13R is disposed on slope 1E of base plate 1R as a portion to which exposed region 3B that is the partial region of metal component 3 adheres. In FIGS. 27 and 28, slope 1E is formed below side surface 1C extending in the Z-direction. However, the present invention not limited to the third embodiment. For example, although not illustrated, slope 1E may be formed on the upper side of side surface 1C extending in the Z-direction.

The partial region of a metal component 3R is bonded along slope 1E to form bonding portion 13R. For this reason, metal component 3R is bent so as to extend in the direction along slope 1E, particularly on the lower side in the Z-direction in FIGS. 27 and 28.

As in FIG. 2 of the first embodiment, FIG. 27 can be interpreted as a schematic diagram in which embedded region 3A in FIG. 28 is omitted. However, even in the third embodiment, as illustrated in FIG. 27, metal component 3R may be in contact with the lowermost surface of case component 2, and the entire portion except for the contact portion may be exposed.

With reference to FIGS. 29 to 34, the method for manufacturing the power module of the second embodiment, particularly the process of forming the casing by bonding base plate 1R and case component 2 will be described below. However, the description of the process that overlaps that of the first embodiment will not be repeated.

Figure 29:
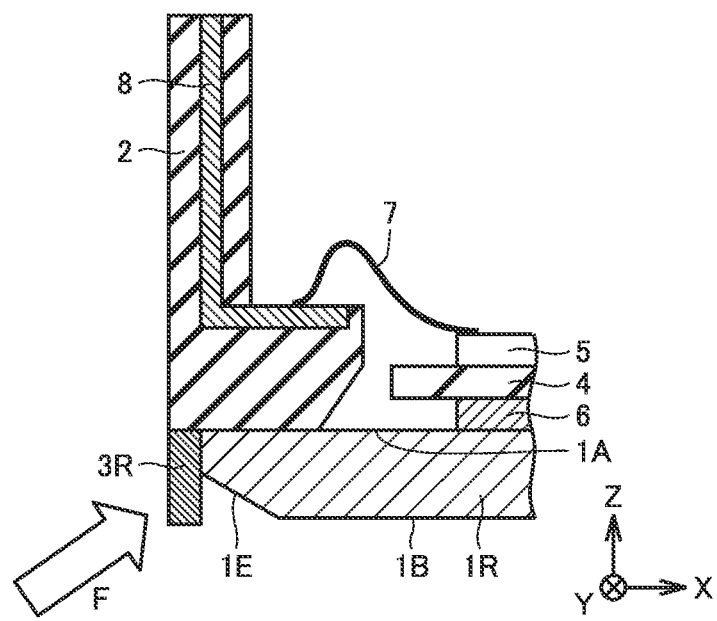
FIG. 29 is a schematic sectional view illustrating particularly the process of causing the metal component and the base plate to adhere to each other in the method for manufacturing the power module of the third embodiment.

FIG. 29 is a schematic sectional view illustrating particularly the process of causing the metal component and the base plate to adhere to each other in the method for manufacturing the power module of the third embodiment. Referring to FIG. 29, for example, base plate 1R including slope 1E that connects other main surface 1B and side surface 1C in the oblique direction with respect to one main surface 1A and other main surface 1B so as to extend and spread from immediately under side surface 1C of base plate 1R toward other main surface 1B is prepared. In the process of bonding base plate 1R and metal component 3R, exposed region 3B of metal component 3R is pressure-bonded onto slope 1E of base plate 1R. For this reason, in the third embodiment, stress F is applied to exposed region 3B of metal component 3R in the direction inclined with respect to the horizontal direction, namely, the direction particularly along a normal to slope 1E. As a result, metal component 3 is bent such that the surface of metal component follows slope 1E particularly at the lower side. At this point, stress F is further applied. As a result, slope 1E and metal component 3R are bonded while adhering to each other. Consequently, bonding portion 13R is formed. For example, although pressure-bonding jig 10A in FIG. 8 may be used in the pressure-bonding process, pressure-bonding jigs 10B to 10D in FIGS. 19 to 21 may be used.

In the third embodiment, preferably the heating temperature of the object is less than or equal to 250° C. in the pressure bonding process. Preferably a pressurization time of the object is less than or equal to 2 seconds. As described above, preferably stress F is uniformly applied to each of the four edges of rectangular base plate 1R. Consequently, metal component 3R of case component 2 and base plate 1R are sealed.

Figure 30:
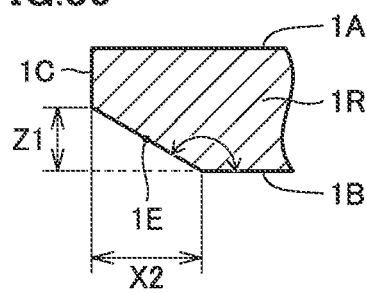
FIG. 30 is a schematic enlarged sectional view illustrating a portion of a slope formed in the base plate of the power module of the third embodiment.

FIG. 30 is a schematic enlarged sectional view illustrating the portion of the slope formed in the base plate of the power module of the third embodiment. Referring to FIG. 30, for example, slope 1E is formed so as to extend from side surface 1C of base plate 1R in the oblique direction with respect to side surface 1C. Preferably the angle formed with main surface 1B as illustrated in FIG. 30 is greater than 90° and less than 180°. Preferably a dimension X2 of slope 1E in FIG. 30 is greater than or equal to ½ and less than or equal to double the thickness of base plate 1Q. Preferably a dimension Z1 of slope 1E in FIG. 30 is greater than or equal to ⅓ and less than or equal to ⅔ of the thickness of base plate 1Q.

Figure 31:
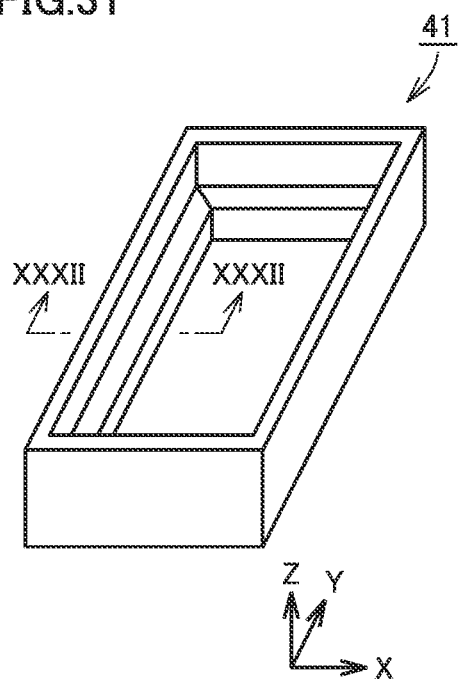
FIG. 31 is a schematic perspective view illustrating a first example of a jig bending the metal component along the slope of the base plate.
Figure 32:
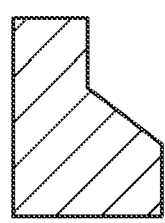
FIG. 32 is a schematic sectional view taken along a line XXXII-XXXII in FIG. 31.
Figure 33:
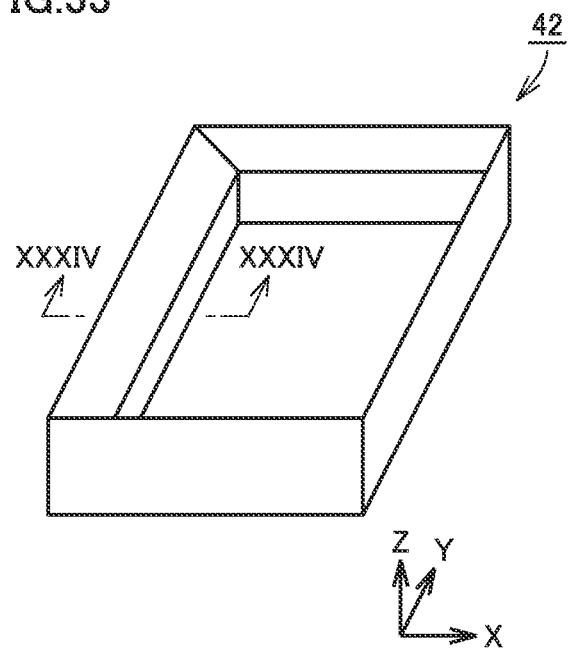
FIG. 33 is a schematic perspective view illustrating a second example of the jig bending the metal component along the slope of the base plate.
Figure 34:
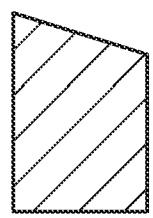
FIG. 34 is a schematic sectional view taken along a line XXXIV-XXXIV in FIG. 33.

FIG. 31 is a schematic perspective view illustrating a first example of a jig bending the metal component along the slope of the base plate. FIG. 32 is a schematic sectional view taken along a line XXXII-XXXII in FIG. 31. FIG. 33 is a schematic perspective view illustrating a second example of the jig bending the metal component along the slope of the base plate. FIG. 34 is a schematic sectional view taken along a line XXXIV-XXXIV in FIG. 33.

Referring to FIGS. 31 and 32, a slope forming jig 41 that is the first example is a jig that forms exposed region 3B of metal component 3R such that exposed region 3B follows side surface 1C of base plate 1R and slope 1E. For this reason, a plane extending and spreading in the vertical direction and a plane extending in the form of the slope from the vertically extending and spreading plane are continuously formed in the sectional view of FIG. 32. On the other hand, referring to FIGS. 33 and 34, a slope forming jig 42 that is the second example is a jig that forms exposed region 3B of metal component 3R such that exposed region 3B follows slope 1E of base plate 1R. For this reason, in the sectional view of FIG. 34, a slope forming slope 1E is formed in the uppermost portion. The inner wall surfaces of slope forming jigs 41, 42 are disposed so as to sandwich side surface 3C, which is directed to the outside of base plate 1R and extends in the Z-direction in the portion where metal component 3R in FIG. 27 is exposed from case component 2. That is, side surface 3C is pressed against the inner wall surfaces of slope forming jigs 41, 42. Consequently, exposed region 3B of insert-molded metal component 3R is bent so as to have the shape following slope 1E of base plate 1R.

An advantageous effect of the second embodiment will be described below.

In the third embodiment, metal component 3R in which the insert molding or the like is formed on case component 2 adheres to slope 1E formed in base plate 1R, particularly pressure-bonded. At the pressure-bonded portion, the surface of metal component 3R and slope 1E of base plate 1R are in direct contact with each other and integrated, which forms bonding portion 13R. In this way, as in the second embodiment, metal component 3R is firmly bonded to slope 1E by the pressure-bonding process. When the pressure-bonding process is performed, the sealing process can easily be performed so as to increase the degree of adhesion by the use of pressure-bonding jigs 10B, 10C, 10D in FIGS. 19 to 21 or slope forming jigs 41, 42 in FIGS. 31 to 34 rather than the use of pressure-bonding jig 10A having the flat leading end in FIG. 8.

Figure 35:
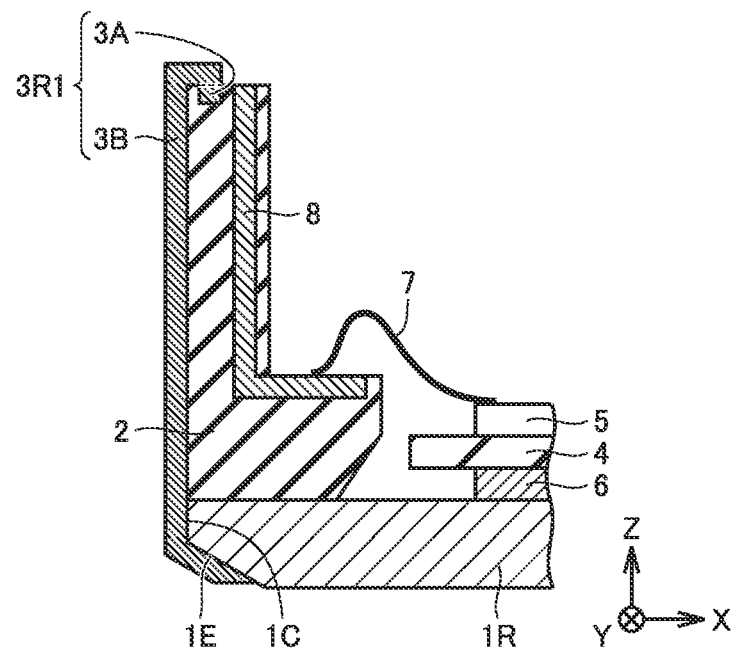
FIG. 35 is a schematic enlarged sectional view illustrating a portion in FIG. 28 in a first modification of the power module of the third embodiment.
Figure 36:
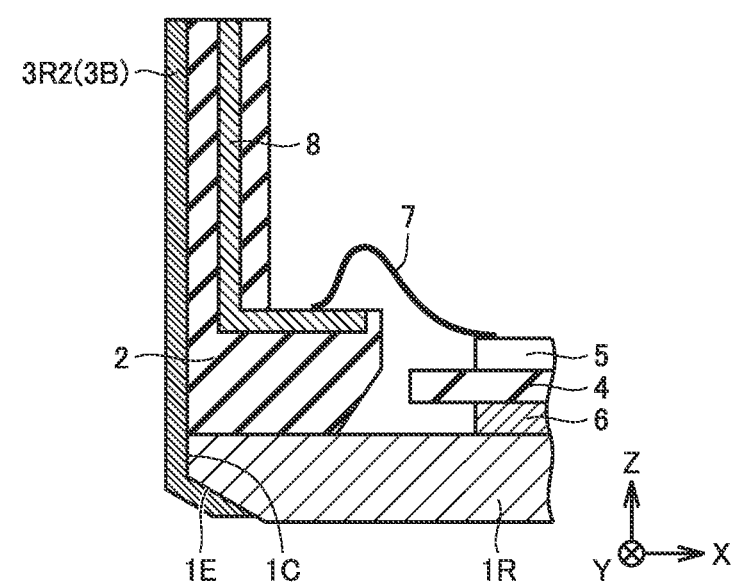
FIG. 36 is a schematic enlarged sectional view illustrating the portion in FIG. 28 in a second modification of the power module of the third embodiment.
Figure 37:
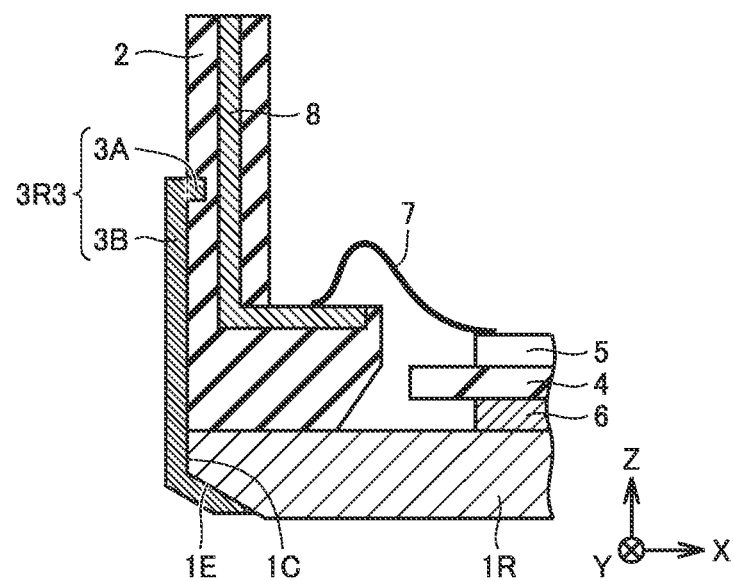
FIG. 37 is a schematic enlarged sectional view illustrating the portion in FIG. 28 in a third modification of the power module of the third embodiment.
Figure 38:
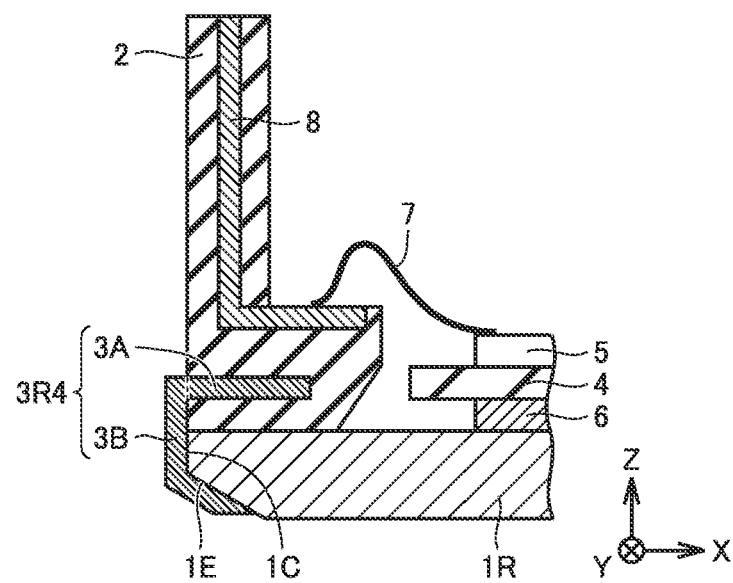
FIG. 38 is a schematic enlarged sectional view illustrating the portion in FIG. 28 in a fourth modification of the power module of the third embodiment.
Figure 39:
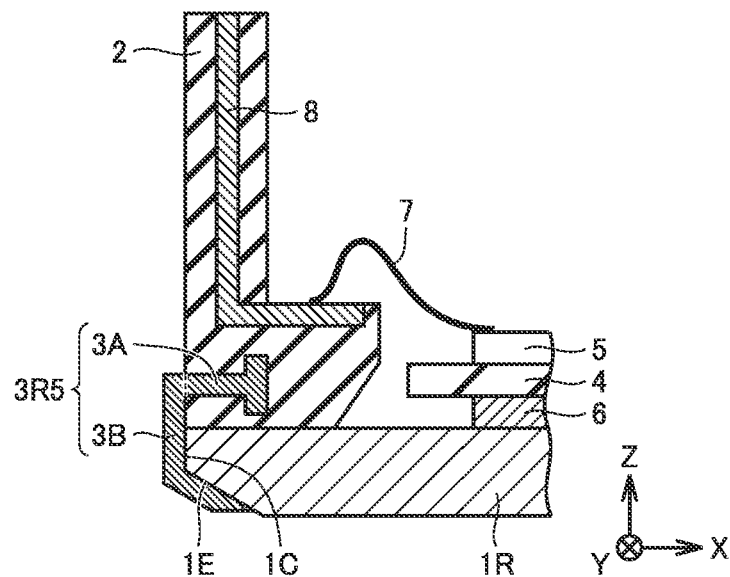
FIG. 39 is a schematic enlarged sectional view illustrating the portion in FIG. 28 in a fifth modification of the power module of the third embodiment.

FIG. 35 is a schematic enlarged sectional view illustrating a portion in FIG. 28 in a first modification of the power module of the third embodiment. FIG. 36 is a schematic enlarged sectional view illustrating the portion in FIG. 28 in a second modification of the power module of the third embodiment. FIG. 37 is a schematic enlarged sectional view illustrating the portion in FIG. 28 in a third modification of the power module of the third embodiment. FIG. 38 is a schematic enlarged sectional view illustrating the portion in FIG. 28 in a fourth modification of the power module of the third embodiment. FIG. 39 is a schematic enlarged sectional view illustrating the portion in FIG. 28 in a fifth modification of the power module of the third embodiment. All the configurations of the regions except for the regions illustrated in each of the modifications are similar to those in FIGS. 15 to 17, and the illustration and description will not be repeated.

Referring to FIGS. 35 to 39, because metal components 3R1, 3R2, 3R3, 3R4, 3R5 of these modifications are similar to metal components 3P1 to 3P5 in FIGS. 10 to 14 except that metal components 3R1, 3R2, 3R3, 3R4, 3R5 are pressure-bonded to slope 1E of base plate 1R, the detailed description will not be repeated. Even in the second embodiment, embedded region 3A and exposed region 3B having the configuration similar to that in FIGS. 10 to 14 may be included.

The surface of exposed region 3B of metal component 3R particularly means the inner wall surface opposed to side surface 1C, and the surface of base plate 1R particularly means slope 1E on the lower side of side surface 1C. However, the present invention is not limited thereto. For example, surfaces such as the uppermost surface, the lowermost surface, and the outer wall surface except for the inner wall surface of exposed region 3B of metal component 3Q and the slope formed on the upper side in the Z-direction of base plate 1Q may be in direct contact with each other and integrated.

Fourth Embodiment

Figure 40:
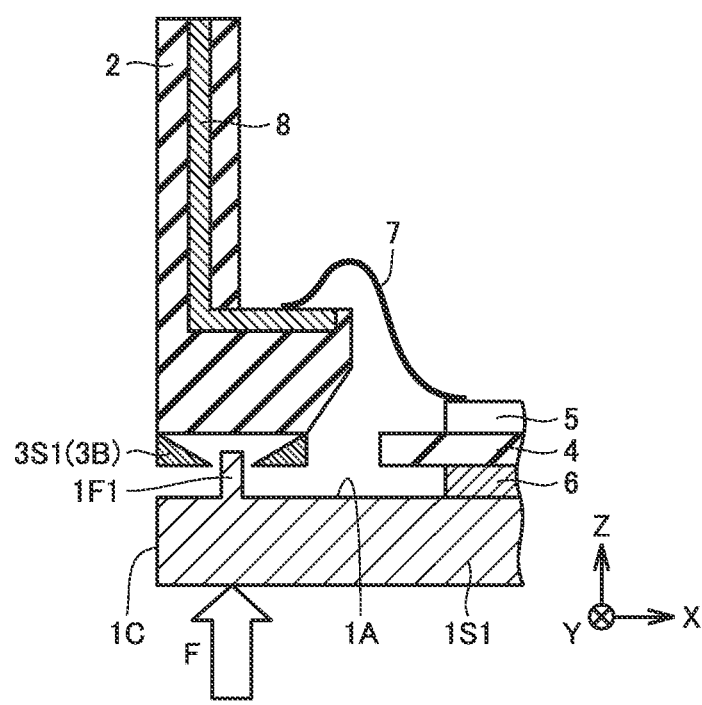
FIG. 40 is a schematic enlarged sectional view illustrating a process of bonding the base plate and the metal component of a first example of a power module according to a fourth embodiment in the portion in FIGS. 2, 16, and 28.
Figure 41:
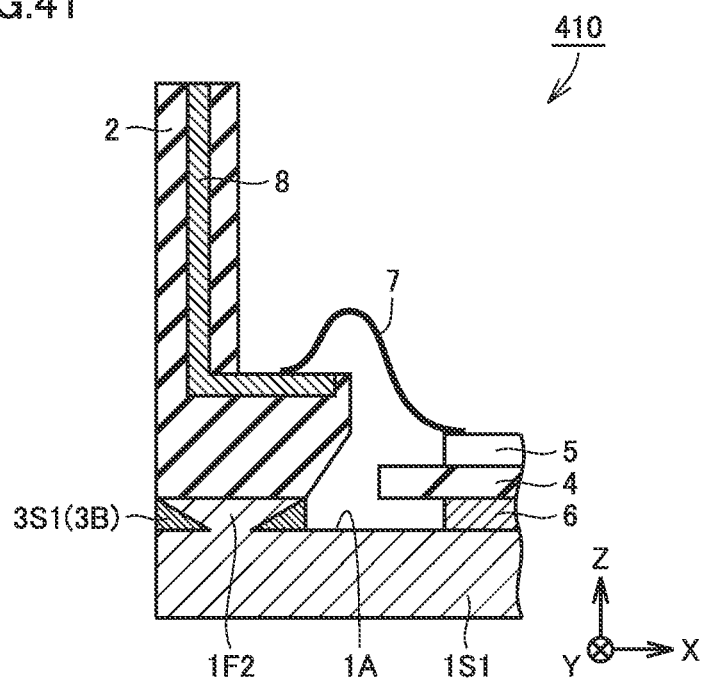
FIG. 41 is a schematic enlarged sectional view illustrating an aspect in which the base plate and the metal component are bonded together as in FIGS. 2, 16, and 28 in the first example of the power module of the fourth embodiment.
Figure 42:
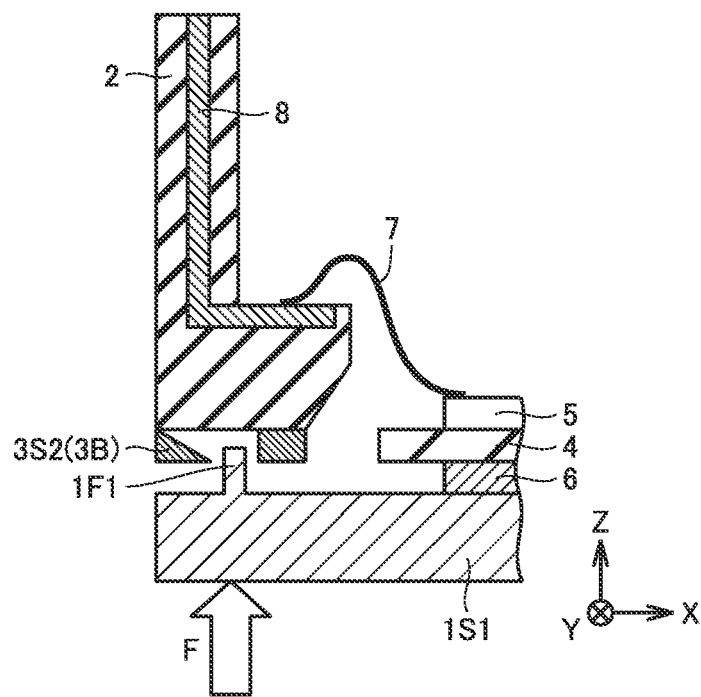
FIG. 42 is a schematic enlarged sectional view illustrating the process of bonding the base plate and the metal component of a second example of the power module of the fourth embodiment in the portion in FIGS. 2, 16, and 28.
Figure 43:
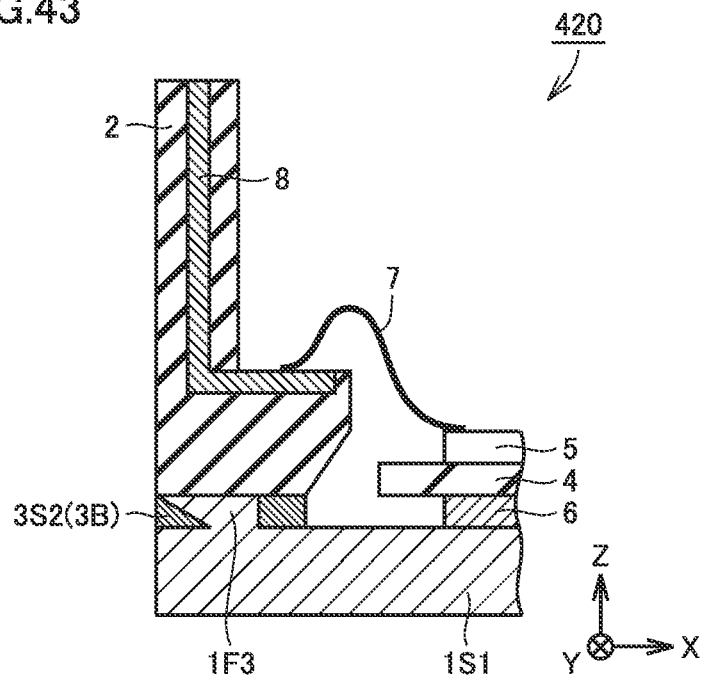
FIG. 43 is a schematic enlarged sectional view illustrating an aspect in which the base plate and the metal component are bonded together as in FIGS. 2, 16, and 28 in the second example of the power module of the fourth embodiment.
Figure 44:
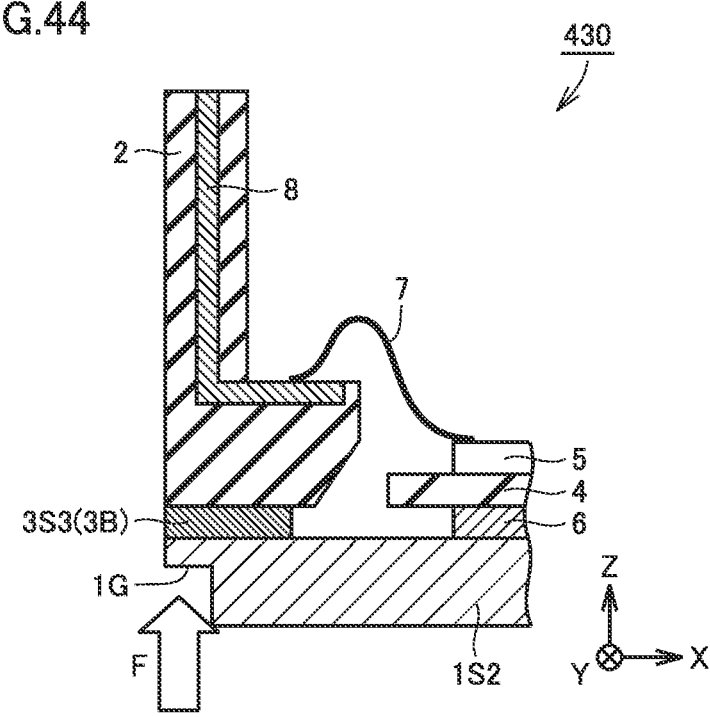
FIG. 44 is a schematic enlarged sectional view illustrating the process of bonding the base plate and the metal component of a third example of the power module of the fourth embodiment and a bonded aspect.

FIG. 40 is a schematic enlarged sectional view illustrating the process of bonding the base plate and the metal component of a first example of a power module according to a fourth embodiment in the portion in FIGS. 2, 16, and 28. FIG. 41 is a schematic enlarged sectional view illustrating an aspect in which the base plate and the metal component are bonded together as in FIGS. 2, 16, and 28 in the first example of the power module of the fourth embodiment. FIG. 42 is a schematic enlarged sectional view illustrating the process of bonding the base plate and the metal component of a second example of the power module of the fourth embodiment in the portion in FIGS. 2, 16, and 28. FIG. 43 is a schematic enlarged sectional view illustrating an aspect in which the base plate and the metal component are bonded together as in FIGS. 2, 16, and 28 in the second example of the power module of the fourth embodiment. FIG. 44 is a schematic enlarged sectional view illustrating the process of bonding the base plate and the metal component of a third example of the power module of the fourth embodiment and a bonded aspect. All the configurations of the regions except for the regions illustrated in each of the examples are similar to those in FIGS. 1 to 3, and the illustration and description will not be repeated.

With reference to FIGS. 40 to 44, as illustrated in each of the first to third embodiments, any position of the surface of metal component 3 insert-molded in case component 2 and any position of the surfaces of base plates 1P to 1R are in direct contact with each other and integrated. Several specific examples are illustrated in the fourth embodiment.

Referring to FIG. 40, exposed region 3B of a metal component 3S1 in which an outer edge or an inner edge inclined with respect to the Z-direction from the lowermost portion in the Z-direction of case component 2 is exposed in the first example of the fourth embodiment. A protrusion 1F1 extending upward in the Z-direction is formed on one main surface 1A of a base plate 1S1. Protrusion 1F1 is inserted into the spatial region sandwiched between the inclined surfaces of exposed region 3B, and a pressure in a direction F indicated by the arrow in FIG. 40 is applied to perform the pressure-bonding process. Consequently, a power module 410 in which metal component 3S1 and base plate 1S1 are bonded by a protrusion 1F2 below the lowermost portion of case component 2 may be formed as illustrated in FIG. 41.

Referring to FIG. 42, in the second example of the fourth embodiment, the inner edge is inclined on the outside of the lowermost portion in the Z-direction of case component 2 as in the first example, and a metal component 3S2 in which the inner edge is not inclined with respect to the Z-direction but extends in a cylindrical shape, namely, the Z-direction on the inside in the Z-direction is exposed. On the other hand, projection 1F1 is formed on base plate 1S1 as in FIG. 40. Protrusion 1F1 is inserted into the spatial region sandwiched between exposed region 3B, and the pressure in direction F indicated by the arrow in FIG. 42 is applied to perform the pressure-bonding process. Consequently, a power module 420 in which metal component 3S2 and base plate 1S1 are bonded by a protrusion 1F3 below the lowermost portion of case component 2 may be formed as illustrated in FIG. 43.

Referring to FIG. 44, in the third example of the fourth embodiment, a thin frame-shaped metal component 3S3 formed by the insert molding is exposed in the lowermost portion in the Z-direction of case component 2. On the other hand, a frame-shaped notch 1G is formed at an outer edge of base plate 1S2 immediately below metal component 3S3 in order to reduce the thickness in the Z-direction as compared to the other regions. The component of thin base plate 1S2 is disposed immediately above notch 1G, and the portion where the component of thin base plate 1S2 is disposed and metal component 3S3 adhere to each other. In this point, stress F indicated by the arrow is applied upward. Consequently, base plate 1S2 and metal component 3S3 are ultrasonic-bonded together. A power module 430 having such a configuration may be formed.

Fifth Embodiment

A fifth embodiment is an application of the power semiconductor devices of the first to fourth embodiments to a power converter. Although the present invention is not limited to a specific power converter, the case that the present invention is applied to a three-phase inverter will be described below as the fifth embodiment.

Figure 45:
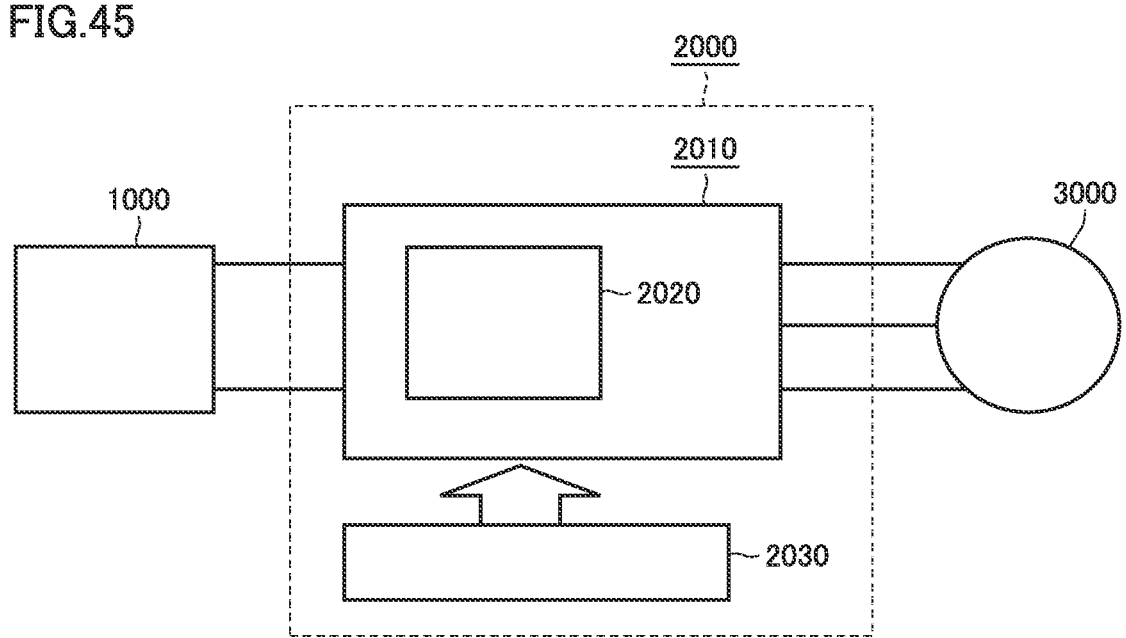
FIG. 45 is a block diagram illustrating a configuration of a power conversion system to which a power converter according to a fifth embodiment is applied.

FIG. 45 is a block diagram illustrating a configuration of a power conversion system to which the power converter of the fifth embodiment is applied. The power conversion system in FIG. 45 includes a power supply 1000, a power converter 2000, and a load 3000. Power supply 1000 is a DC power supply, and supplies DC power to power converter 2000. Power supply 1000 is not particularly limited. For example, power supply 1000 may be constructed with a DC system, a solar cell, or a storage battery, or constructed with a rectifier circuit or an AC-DC converter connected to an AC system. Power supply 1000 may be constructed with a DC-DC converter that converts the DC power output from the DC system into predetermined power.

Power converter 2000 is a three-phase inverter connected between power supply 1000 and load 3000, converts the DC power supplied from power supply 1000 into AC power, and supplies the AC power to load 3000. As illustrated in FIG. 45, power converter 2000 includes a main conversion circuit 2010 that converts the input DC power into the AC power and outputs the AC power and a control circuit 2030 that outputs a control signal controlling main conversion circuit 2010 to main conversion circuit 2010.

Load 3000 is a three-phase motor driven by the AC power supplied from power converter 2000. Load 3000 is not limited to a specific application, but is a motor mounted on various electric appliances. For example, load 3000 is used as a hybrid car, an electric car, a rail vehicle, an elevator, or a motor for an air conditioner.

Power converter 2000 will be described in detail below. Main conversion circuit 2010 includes a switching element (not illustrated) and a reflux diode (not illustrated). The switching element switches voltage supplied from power supply 1000, whereby main conversion circuit 2010 converts the DC power supplied from power supply 1000 into the AC power and supplies the AC power to load 3000. Although there are various specific circuit configurations of main conversion circuit 2010, main conversion circuit 2010 of the fifth embodiment is a two-level three-phase full bridge circuit, and is constructed with six switching elements and six reflux diodes connected in reversely parallel to six switching elements. An IGBT and the reflux diode of semiconductor element 5 included in the power module of any one of the first to fourth embodiments can be applied as each switching element and each reflux diode of main conversion circuit 2010. The power module of any one of the first to fourth embodiments can be applied as a power semiconductor module 2020 constituting main conversion circuit 2010. Six switching elements are connected in series in every two switching elements to constitute upper and lower arms, and each upper and lower arm constitutes each phase (U-phase, V-phase, W-phase) of the full bridge circuit. Output terminals of the upper and lower arms, namely, three output terminals of main conversion circuit 2010 are connected to load 3000.

Main conversion circuit 2010 includes a drive circuit (not illustrated) that drives each switching element. The drive circuit may be incorporated in power semiconductor module 2020, or provided outside power semiconductor module 2020. The drive circuit generates a drive signal driving the switching element included in main conversion circuit 2010, and supplies the drive signal to a control electrode of the switching element of main conversion circuit 2010. Specifically, the drive signal turning on the switching element and the drive signal turning off the switching element are output to the control electrode of each switching element according to a control signal from a control circuit 2030.

As described above, in power converter 2000 of the fifth embodiment, power modules 100, 200 of any one of the first to fourth embodiments are applied as the power semiconductor module included in main conversion circuit 2010. For this reason, the manufacturing process and cost of the power module can be reduced in the power converter 2000 of the fifth embodiment.

Although the example in which the present invention is applied to the two-level three-phase inverter is described in the fifth embodiment, the present invention is not limited to the fifth embodiment, but can be applied to various power converters. Although the two-level power converter is used in the fifth embodiment, a three-level power converter may be used. Alternatively, a multilevel power converter may be used. When the power converter supplies the power to a single-phase load, the present invention may be applied to a single-phase inverter. When the power converter supplies the power to a DC load or the like, the present invention may be applied to a DC-DC converter or an AC-DC converter.

The power converter to which the present invention is applied is not limited to the case that the load is the motor. For example, the power converter may be incorporated in a power supply device of an electric discharge machine or a laser processing machine or a power supply device of an induction heating cooker or a noncontact power supply system. The power converter to which the present invention is applied can be used as a power conditioner of a solar power generation system or a storage system.

The features described in the above embodiments (examples included in the embodiments) may appropriately be combined within a range where technical contradiction is not generated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a metal base plate;
a case component; and
a metal component fixed to said case component,
wherein a partial region of said metal component is exposed from said case component,
said partial region is bonded to said base plate at a bonding portion,
where a surface of said partial region and a surface of said base plate are in direct contact with each other, and
the surface of said partial region is adhered to the surface of said base plate.

2. The semiconductor device according to claim 1, wherein said bonding portion is disposed as a portion where said partial region adheres to a surface of a wedge-shaped portion formed on the surface of said base plate.

3. The semiconductor device according to claim 1, wherein said bonding portion is disposed as a portion where said partial region adheres onto a slope connecting one main surface of said base plate and the other main surface on an opposite side to said one main surface in an oblique direction with respect to said one main surface and said other main surface.

4. A power converter comprising:
a main conversion circuit including the semiconductor device according to claim 1, the main conversion circuit converting and outputting input power; and
a control circuit that outputs a control signal controlling said main conversion circuit to said main conversion circuit.

* * * * *